(12) United States Patent
Nishikawa et al.

(10) Patent No.: US 7,180,798 B2
(45) Date of Patent: Feb. 20, 2007

(54) SEMICONDUCTOR PHYSICAL QUANTITY SENSING DEVICE

(75) Inventors: Mutsuo Nishikawa, Nagano (JP); Katsumichi Ueyanagi, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 10/406,604

(22) Filed: Apr. 4, 2003

(65) Prior Publication Data
US 2004/0027872 A1 Feb. 12, 2004

Related U.S. Application Data

(63) Continuation-in-part of application No. 10/120,778, filed on Apr. 12, 2002, now abandoned.

(30) Foreign Application Priority Data

Apr. 12, 2001 (JP) ............................. 2001-114332
Apr. 9, 2002 (JP) ............................. 2002-107187

(51) Int. Cl.
*G11C 7/00* (2006.01)
*G01N 27/04* (2006.01)
*H01L 41/00* (2006.01)
*G06G 7/28* (2006.01)

(52) U.S. Cl. ...................... 365/191; 365/94; 365/211; 365/189.01; 327/56; 327/68; 327/356; 327/509; 327/513; 327/516

(58) Field of Classification Search ................ 365/207, 365/189.01, 191, 211, 94; 702/130, 138
See application file for complete search history.

(56) References Cited

U.S. PATENT DOCUMENTS 4,303,978 A * 12/1981 Shaw et al. .................. 701/220
4,503,707 A * 3/1985 Rosa et al. ................... 374/142
5,461,584 A * 10/1995 Ikuta et al. ................... 327/516
5,544,529 A     8/1996 Mitani et al.
5,686,913 A * 11/1997 Coln et al. ..................... 341/51

(Continued)

FOREIGN PATENT DOCUMENTS

DE          44 35 754 A1     4/1995

(Continued)

OTHER PUBLICATIONS

Office Action dated Jul. 21, 2003 for U.S. Appl. No. 10/120,778.

*Primary Examiner*—Amir Zarabian
*Assistant Examiner*—Ly Duy Pham
(74) *Attorney, Agent, or Firm*—Staas & Halsey LLP

(57) ABSTRACT

A semiconductor physical quantity sensing device to perform electrical trimming at low cost by using a CMOS manufacturing process and a small number of terminals. The semiconductor physical quantity sensing device includes a wheatstone bridge circuit, which is a sensor element, an auxiliary memory circuit, which stores provisional trimming data, a main memory circuit, which stores finalized trimming data, an adjusting circuit, which adjusts the output characteristics of the sensor element based on trimming data stored in the auxiliary memory circuit or the main memory circuit, with the elements and circuits being only configured of active elements and passive elements manufactured by way of the CMOS manufacturing process formed on a same semiconductor chip.

21 Claims, 19 Drawing Sheets

U.S. PATENT DOCUMENTS

| | | |
|---|---|---|
| 5,805,466 A | 9/1998 | Roeckner et al. |
| 5,848,618 A | 12/1998 | Guest et al. |
| 5,995,033 A * | 11/1999 | Roeckner et al. ............ 341/155 |
| 6,051,447 A * | 4/2000 | Lee et al. ...................... 438/48 |
| 6,122,975 A | 9/2000 | Sridhar et al. |
| 6,141,243 A | 10/2000 | Aslam et al. |
| 6,144,229 A | 11/2000 | Blossfeld et al. |
| 6,163,191 A * | 12/2000 | Miyagi ........................ 327/208 |
| 6,184,928 B1 * | 2/2001 | Kannegundla et al. ...... 348/294 |
| 6,243,284 B1 * | 6/2001 | Kumagai .................... 365/104 |
| 6,246,968 B1 | 6/2001 | Wilczek et al. |
| 6,291,859 B1 * | 9/2001 | Litwin et al. ............... 257/368 |
| 6,307,477 B1 * | 10/2001 | Starkey et al. .............. 340/584 |
| 6,332,359 B1 | 12/2001 | Veyanagi et al. |
| 6,342,807 B1 * | 1/2002 | Nolan et al. ................ 327/525 |
| 6,357,298 B1 | 3/2002 | Draxelmayr et al. |
| 6,427,129 B1 * | 7/2002 | Lalla ........................... 702/88 |
| 6,446,600 B1 * | 9/2002 | Scherer et al. .............. 123/399 |
| 6,596,483 B1 * | 7/2003 | Choong et al. ................ 435/6 |
| 6,744,646 B2 * | 6/2004 | Huang et al. .................. 363/59 |
| 6,912,172 B2 * | 6/2005 | Honma et al. .............. 365/226 |
| 2003/0008464 A1 * | 1/2003 | Oh et al. ..................... 438/289 |
| 2003/0086011 A1 * | 5/2003 | Wu et al. .................... 348/308 |
| 2004/0065808 A1 * | 4/2004 | Kochi et al. ............. 250/214.1 |
| 2005/0062085 A1 * | 3/2005 | He et al. ..................... 257/292 |

FOREIGN PATENT DOCUMENTS

| | | |
|---|---|---|
| DE | 693 06 051 T2 | 4/1997 |
| DE | 196 47 897 A1 | 3/1998 |
| DE | 0 919 789 A1 | 2/1999 |
| DE | 197 43 288 A1 | 4/1999 |
| DE | 199 03 585 A1 | 8/1999 |
| EP | 0 677 721 A1 | 4/1994 |
| EP | 0 793 075 A1 | 3/1997 |
| JP | 5-118934 | 5/1993 |
| JP | 06-029555 | 2/1994 |
| WO | WO 98/21756 | 3/1998 |
| WO | WO 98/25115 | 6/1998 |

* cited by examiner

| MODE No. | E | DS | CLK | CONTROL DATA A | CONTROL DATA B | CG | EV | SR CONTROL SIGNAL | SR/EP | INPUT/OUTPUT | OPERATION DESCRIPTION |
|---|---|---|---|---|---|---|---|---|---|---|---|
| 1 | L | — | ↑ | L | L | NC | NC | L | EP | IN | SERIAL DATA INPUT TO SR |
| 2 | H | — | ↑ | L | L | NC | NC | L | EP | OUT | SERIAL DATA OUTPUT FROM SR |
| 3 | H | L | L | H | L | NC | NC | L | SR | OUT | TRIMMING USING SR DATA |
| 4 | L | L | L | — | — | NC | NC | L | EP | IN | TRIMMING USING EPROM DATA (STEADY STATE) |
| 5 | H | L | L | H | H | NC | NC | L | — | OUT | TRANSFER SR DATA TO EPROM |
| 6 | H | L | L | H | H | 26V | 13V | L | — | OUT | WRITE SR DATA TO EPROM |
| 7 | H | L | L | L | H | NC | NC | H | EP | OUT | TRANSFER EPROM DATA TO SR |

FIG. 4

| No. | DS | CG/CLK | CONTROL DATA | | | EV | SR CONTROL SIGNAL | SR/EP | INPUT/OUTPUT | OPERATION DESCRIPTION |
|---|---|---|---|---|---|---|---|---|---|---|
| | | | A | B | C | | | | | |
| 1 | — | ↓ | L | L | L | NC | L | EP | IN | SERIAL DATA INPUT TO SR |
| 2 | — | ↓ | L | L | H | NC | L | EP | OUT | SERIAL DATA OUTPUT FROM SR |
| 3 | L | L | H | L | H | NC | L | SR | OUT | TRIMMING USING SR DATA |
| 4 | L | L | — | — | L | NC | L | EP | IN | TRIMMING USING EPROM DATA (STEADY STATE) |
| 5 | L | L | H | H | H | NC | L | — | OUT | SR DATA TRANSFER TO EPROM |
| 6 | L | 26V | H | H | H | 13V | L | — | OUT | SR DATA WRITE TO EPROM |
| 7 | L | L | L | H | H | NC | H | EP | OUT | EPROM DATA TRANSFER TO SR |

FIG. 13

SEMICONDUCTOR PHYSICAL QUANTITY SENSING DEVICE

CROSS-REFERENCE TO RELATED APPLICATIONS

This application is a continuation-in-part of U.S. Ser. No. 10/120,778, filed Apr. 12, 2002, now abandoned. This application also claims the benefit of Japanese application nos. 2001-114332, filed Apr. 12, 2001, and 2002-107187, filed Apr. 9, 2002, the disclosures of which are incorporated herein by reference.

BACKGROUND OF THE INVENTION

1. Field of the Invention

The present invention relates to semiconductor physical quantity sensing devices such as pressure sensors, acceleration sensors, and the like used in various kinds of apparatuses for automotive use, medical use, industrial use, etc., and more particularly to semiconductor physical quantity sensing devices having a configuration which performs sensitivity adjustment, adjustment of temperature characteristics, offset adjustment, etc., by way of electric trimming using an EPROM.

2. Description of the Related Art

Recently, electric trimming methods and apparatuses for adjusting the output characteristics of physical quantity sensors enable adjustment after an assembly process, because conventional laser trimming methods have the disadvantage of not permitting re-adjustment even when a variation in output characteristics occurs during the assembly process following trimming. However, electric trimming results in increased manufacturing costs caused by an increase in the number of wire bonding points, due to the need for numerous control terminals for inputting/outputting trimming data, writing data into the EPROM, etc. In order to solve this problem, proposals have been made to perform electric trimming with a small number of terminals by creating a plurality of terminal operation threshold voltages by using resistive potential division and bipolar transistors. (For example Japanese Patent Application Laid-open No. Hei6-29555.)

However, since the above-mentioned proposal uses bipolar transistors, with a mixing of EPROM(s) made by the CMOS process with bipolar transistors, the BiCMOS process becomes necessary, which has the disadvantage of inviting cost increases. To solve this problem, the use of MOS transistors, in place of the bipolar transistors in the above-mentioned proposal, has been considered. However, in such a case, the upper limit of the threshold voltages that can be set with MOS transistors is lower than with bipolar transistors, so the spacing between the plurality of thresholds becomes smaller and there is the disadvantage that mis-operation is more likely to occur. To prevent such problems, it is necessary to increase the upper limit of the threshold voltages to a level equal to that of bipolar transistors but to do that, it is necessary to make MOS transistors capable of higher voltage tolerances and to add new protection circuits, which has the problem of inviting further cost increases.

SUMMARY OF THE INVENTION

With the foregoing in view, it is an object of the present invention to provide a semiconductor physical quantity sensing device capable of electric trimming which can be manufactured by a CMOS manufacturing process, which is low in cost, and only includes a small number of terminals.

To achieve the above-mentioned objective, the semiconductor physical quantity sensing device of the present invention includes a sensing element, an auxiliary memory circuit such as a shift register that stores provisional trimming data, a main memory circuit such as an EPROM that stores the finalized trimming data, and an adjusting circuit that adjusts the output characteristics of the sensor element based on trimming data stored in the auxiliary memory circuit or the main memory circuit. These elements and circuits are formed on the same semiconductor chip and are configured only of active elements and passive elements which can be manufactured by the CMOS manufacturing process. In addition, the semiconductor physical quantity sensing device has an output terminal, a trimming data input terminal, a terminal for providing a ground potential, a terminal for providing operating voltage, a terminal for inputting an external clock, a terminal for inputting a control signal for the internal digital circuit(s), and one or two terminals for providing voltages for writing data into the main memory circuit, for a total of seven or eight terminals.

According to the present invention, by measuring the sensor output while gradually changing provisional trimming data stored in the auxiliary memory circuit, and trimming data, which results in the desired sensor output, can be determined and stored in the main memory circuit. In the normal operating state, the sensor output may be adjusted by the adjusting circuit using trimming data stored in the main memory circuit. These elements, the auxiliary memory circuit, main memory circuit, and adjusting circuit are configured only of active elements and passive elements manufactured by means of the CMOS manufacturing process and, together with five to eight terminals, are formed on the same semiconductor chip.

BRIEF DESCRIPTION OF THE DRAWINGS

These and other objects and advantages of the present invention will become apparent and more readily appreciated from the following description of the embodiments, taken in conjunction with the accompanying drawings of which:

FIG. 4 is a table illustrating operating modes of a semiconductor pressure-sensing device of the embodiment of the present invention shown in FIG. 2;

FIG. 13 is a table describing the operation modes of the pressure-sensing device of the embodiment of the present invention shown in FIG. 10;

DETAILED DESCRIPTION OF THE PREFERRED EMBODIMENTS

Figure 1:
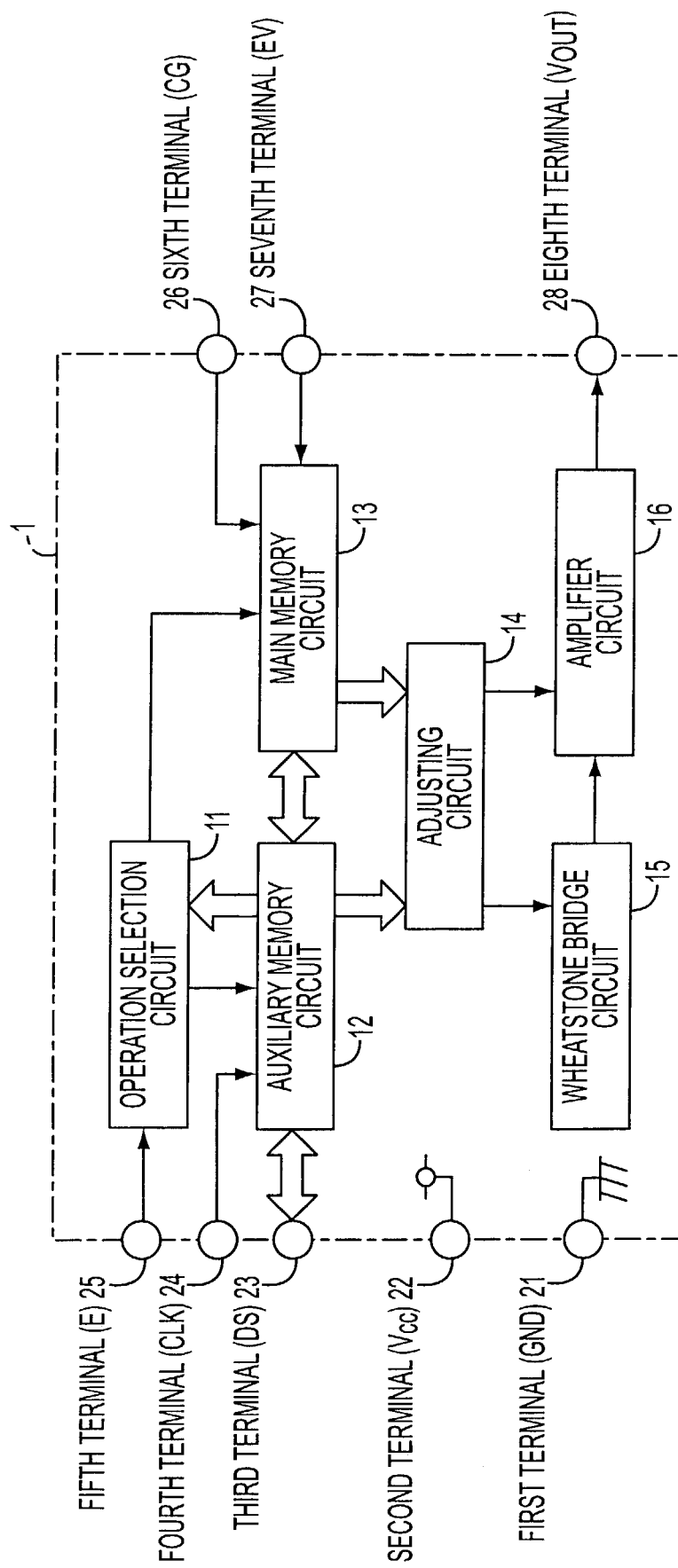
FIG. 1 is a block diagram illustrating a semiconductor physical quantity sensing device according a first embodiment of the present invention.

Reference will now be made in detail to the embodiments of the present invention, examples of which are illustrated in the accompanying drawings, wherein like reference numerals refer to the like elements throughout. The embodiments are described below in order to explain the present invention by referring to the figures.

FIG. 1 is a block diagram showing one example of a semiconductor physical quantity sensing device according to a first embodiment of the present invention. This semiconductor physical quantity sensing device 1 includes, for example, operation selection circuit 11, auxiliary memory circuit 12, main memory circuit 13, adjusting circuit 14, wheatstone bridge circuit 15 formed of sensor elements, amplifier circuit 16 and eight (first through eighth) terminals 21 to 28, respectively.

First terminal 21 supplies a ground potential to semiconductor physical quantity sensing device 1. Second terminal 22 supplies an operating voltage to semiconductor physical quantity sensing device 1. Third terminal 23 performs inputting/outputting of serial digital data (serial data). Fourth terminal 24 inputs an external clock. Fifth terminal 25 inputs a control signal to the internal digital circuit. Sixth terminal 26 supplies a voltage that is equal to or higher than the operating voltage applied to second terminal 22. Seventh terminal 27 supplies a voltage that is equal to or higher than the operating voltage applied to second terminal 22 and is different from the voltage applied to sixth terminal 26. Eighth terminal 28 outputs to the exterior a signal of semiconductor physical quantity sensing device 1.

Auxiliary memory circuit 12, according to an operation timing of the above-mentioned external clock, converts the serial digital data supplied from the exterior into parallel digital data (parallel data) that will be used internally. In addition, auxiliary memory circuit 12 converts the parallel digital data used internally into serial digital data for outputting to the exterior. Further, auxiliary memory circuit 12 also supplies control data to operation selection circuit 11. In accordance with the applied voltages of sixth terminal 26 and seventh terminal 27, main memory circuit 13 stores the trimming data which includes the parallel digital data supplied from auxiliary memory circuit 12.

Operation selection circuit 11, based on the control signal inputted into fifth terminal 25 and the control data supplied from auxiliary memory circuit 12, supplies a signal to control input/output of data, to auxiliary memory circuit 12 and main memory circuit 13. Wheatstone bridge circuit 15 generates an output signal responsive to a physical quantity of a medium being measured. Amplifier circuit 16 amplifies the output signal of wheatstone bridge circuit 15 and outputs that to the exterior via eighth terminal 28. Adjusting circuit 14, based on trimming data supplied from auxiliary memory circuit 12 or main memory circuit 13, performs sensitivity adjustments to wheatstone bridge circuit 15, taking into account temperature characteristics, and performs offset adjustments to amplifier circuit 16, again taking into account temperature characteristics.

Figure 2:
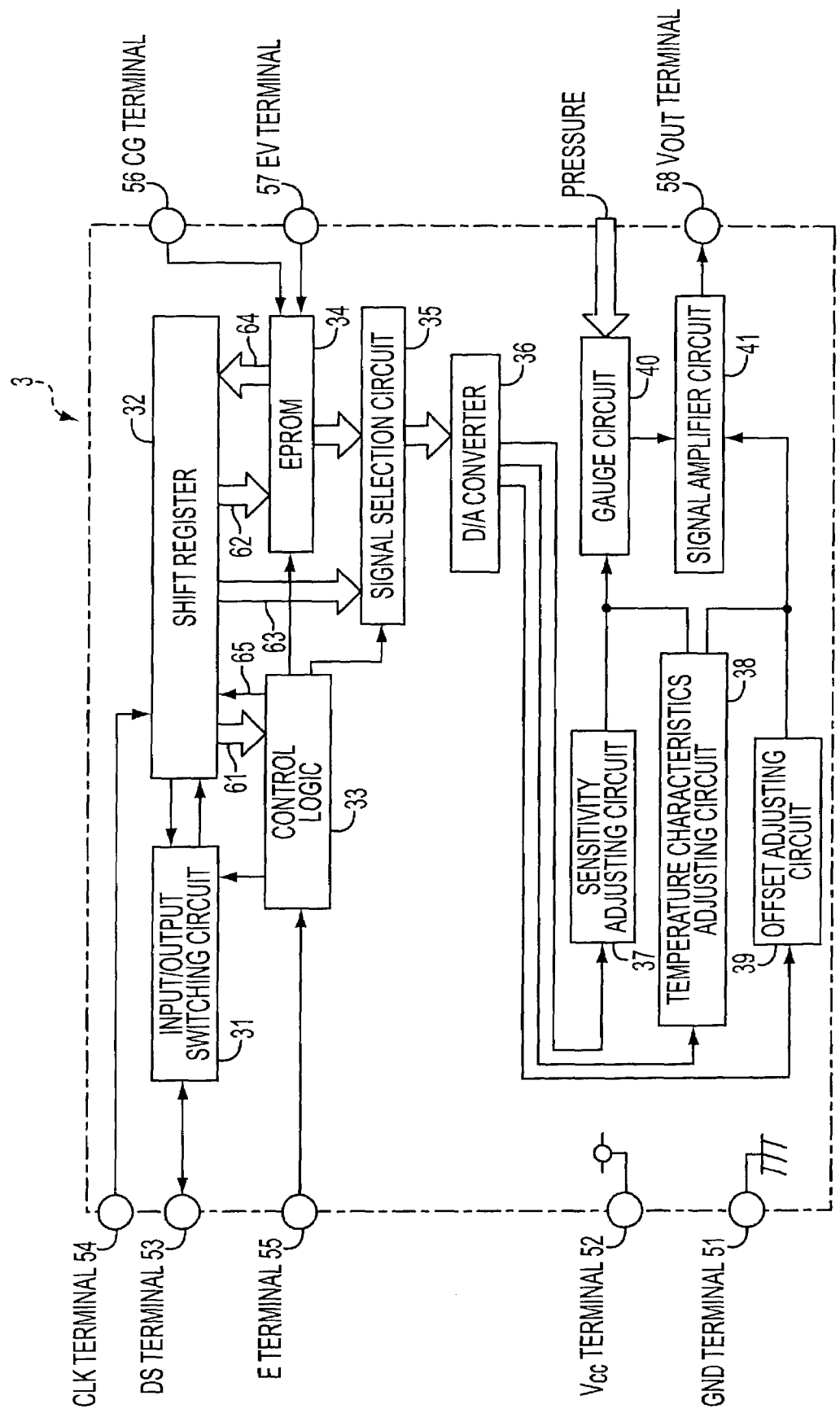
FIG. 2 is a block diagram illustrating a semiconductor pressure-sensing device formed on a semiconductor chip according to the first embodiment of the present invention.

FIG. 2 is a block diagram showing one example of a semiconductor pressure-sensing device formed on a semiconductor chip according to an embodiment of the present invention. Semiconductor pressure-sensing device 3 comprises input/output switching circuit 31, shift register 32, control logic 33, EPROM 34, signal selection circuit 35, D/A converter 36, sensitivity adjusting circuit 37, temperature characteristics adjusting circuit (hereinafter, "TC adjusting circuit") 38, offset adjusting circuit 39, gauge circuit 40 and signal amplifier circuit 41. Input/output switching circuit 31, shift register 32, control logic 33, EPROM 34, signal selection circuit 35, D/A converter 36, sensitivity adjusting circuit 37, TC adjusting circuit 38, offset adjusting circuit 39, gauge circuit 40 and signal amplifier circuit 41 are formed on the same semiconductor chip and are configured only from active and passive elements which are manufactured by means of a CMOS manufacturing process. In addition, for semiconductor pressure-sensing device 3 to receive power from the exterior and transfer signals to/from the exterior, GND terminal 51, Vcc terminal 52, DS terminal 53, CLK terminal 54, E terminal 55, CG terminal 56, EV terminal 57 and Vout terminal 58 are also provided.

GND terminal 51 and Vcc terminal 52 each supply to semiconductor pressure-sensing device 3 ground potential and power supply potential of, for example, and without particular limitation, 5V. DS terminal 53 is provided to send/receive serial digital data between semiconductor pressure-sensing device 3 and circuits external to it. CLK terminal 54 supplies an external clock to semiconductor pressure-sensing device 3. An "enable" signal is provided to E terminal 55 from the exterior, to control the operating state of the digital circuit(s) inside semiconductor pressure-sensing device 3. The Vout terminal 58 outputs the detection signal of semiconductor pressure-sensing device 3 to the exterior of the device.

When data is being written into EPROM 34, a voltage higher than that applied to Vcc 52, for example, and without particular limitation, 26V, is applied to CG terminal 56. In addition, when data is being written into EPROM 34, a voltage higher than the operating voltage applied to Vcc terminal 52 and also different from the voltage applied to CG terminal 56, for example, and without particular limitation, 13V, is applied to EV terminal 57. It may also be configured such that CG terminal 56 and EV terminal 57 are used jointly, that is, as the same terminal, so that based on the voltage applied to one terminal, the voltage applied to the other terminal is produced.

Input/output switching circuit 31 performs switching between a mode where trimming data, includes serial digital data supplied from the exterior via DS terminal 53, and is supplied to shift register 32 and the mode where serial digital data supplied from shift register 32 is supplied to the exterior via DS terminal 53. Shift register 32, synchronized to the above-mentioned external clock, converts serial digital data supplied from the exterior into parallel digital data. In addition, shift register 32 converts the trimming data, which includes parallel digital data stored in EPROM 34, into serial digital data.

EPROM 34 stores trimming data including parallel digital data supplied from shift register 32. Signal selection circuit 35 selects either trimming data having parallel digital data supplied from shift register 32 or trimming data having parallel digital data supplied from EPROM 34, and supplies it to D/A converter 36. Control logic 33, based on an "enable" signal inputted from E terminal 55 and control data supplied from shift register 32, generates control signals and outputs them to input/output switching circuit 31, shift register 32, EPROM 34 and signal selection circuit 35 to control the operation of each of these. Here, to facilitate description, the control signal supplied to shift register 32 from control register 33 is designated as shift register control signal 65. D/A converter 36 converts trimming data having parallel digital data to analog data.

Gauge circuit 40 is configured from a semiconductor strain gauge, which, for example, generates an output signal responsive to applied pressure. Signal amplifier circuit 41 amplifies a signal generated by gauge circuit 40 and outputs it to the exterior via Vout terminal 58. Sensitivity adjusting circuit 37 trims a current applied to gauge circuit 40 according to the output of D/A converter 36. Similarly, offset adjusting circuit 39 trims a reference voltage used for adjusting the offset of signal amplifier circuit 41 according to the output of D/A converter 36. TC adjusting circuit 38 performs addition/subtraction to the outputs of sensitivity adjusting circuit 37 and offset adjusting circuit 39 according to the output of D/A converter 36.

Here, input/output switching circuit 31, shift register 32, control logic 33, EPROM 34, signal selection circuit 35, and D/A converter 36 correlate to a digital circuit portion. In contrast, sensitivity adjusting circuit 37, TC adjusting circuit 38, offset adjusting circuit 39, gauge circuit 40 and signal amplifier circuit 41 correlate to an analog circuit portion.

In the above-mentioned configuration, shift register 32 may perform the function of auxiliary memory circuit 12. EPROM 34 performs the function of main memory circuit 13. Input/output switching circuit 31, control logic 33, and signal selection circuit 35 may perform the function of operation selection circuit 11. D/A converter 36, sensitivity adjusting circuit 37, TC adjusting circuit 38 and offset adjusting circuit 39 may perform the function of adjusting circuit 14. Gauge circuit 40 may perform the function of wheatstone bridge 15. Signal amplifier circuit 41 may perform the function of amplifier circuit 16. In addition, GND terminal 51, Vcc terminal 52, DS terminal 53, CLK terminal 54, E terminal 55, CG terminal 56, EV terminal 57 and Vout terminal 58 would correspond, respectively, to the first through eighth terminals 21 to 28.

Figure 3:
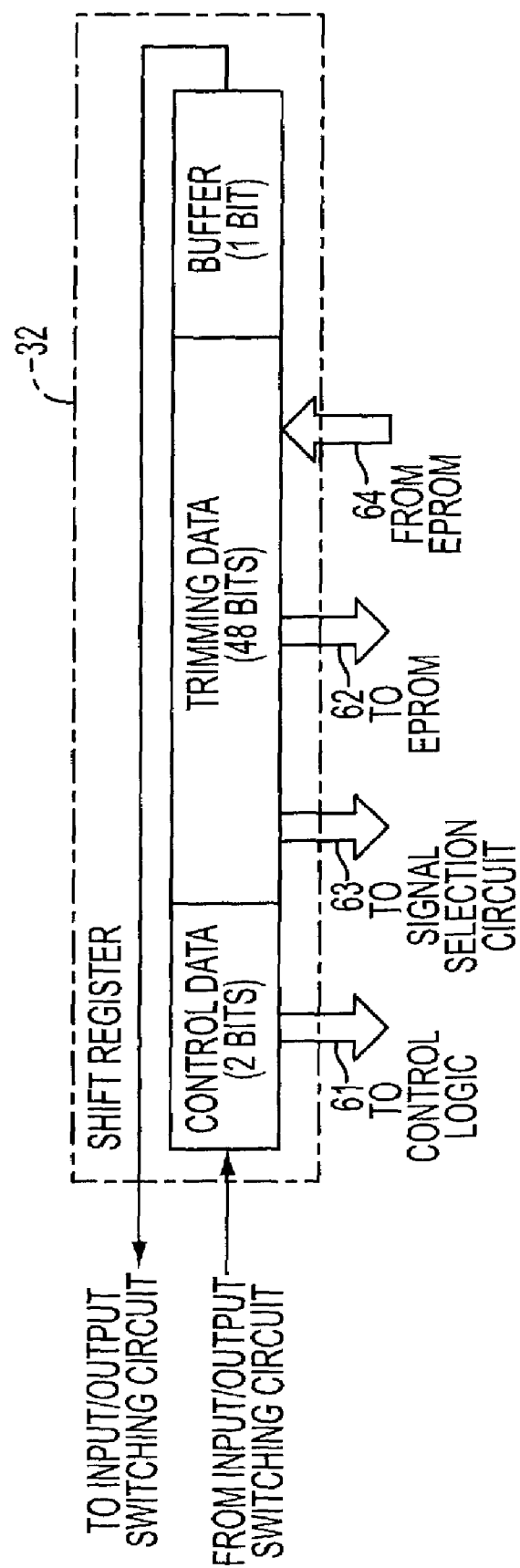
FIG. 3 is a diagram illustrating an example of a shift register configuration in a semiconductor pressure-sensing device of the embodiment of the present invention shown in FIG. 2.

FIG. 3 is a diagram illustrating, in a simplified form, one example of a configuration for shift register 32. A bit count of shift register 32 may be, for example, and without particular limitation, 51 bits. Of those, two bits store control data 61, which is supplied to control logic 33. Following these two bits, 48 bits are used to store either data 62, which is supplied to EPROM 34, trimming data 63, which is supplied to signal selection circuit 35, or data 64, which is supplied from EPROM 34. The remaining one bit is used as a buffer.

Next, while referring to FIG. 4, various control signals and a relationship between the applied voltages and the operating modes of semiconductor pressure-sensing device 3 will be described. When an external clock is inputted to CLK terminal 54, both CG terminal 56 and EV terminal 57 are in a "non-charged" state, E terminal 55 input is at a L level, and the 2 bits of control data 61 (A and B) are at the L level, upon inputting serial digital data to DS terminal 53, shift register (SR) control signal 65 then goes to the L level, signal selection circuit 35 selects EPROM 34, and input/output switching circuit 31 goes to "input." As a result, serial digital data from the exterior is inputted into shift register 32 (Mode No. 1).

When an external clock is inputted to CLK terminal 54, both CG terminal 56 and EV terminal 57 are in the "non-charged" state, E terminal 55 input is at a H level, and the 2 bits of control data 61 (A and B) are at the L level, shift register control signal 65 then goes to the L level, signal selection circuit 35 selects EPROM 34, and input/output switching circuit 31 goes to "output." As a result, serial digital data from shift register 32 is outputted to the exterior (Mode No. 2).

When E terminal 55 input is at the H level, DS terminal 53 input is at the L level, CLK terminal 54 input is at the L level, the first bit (A) and second bit (B) of control data 61 are respectively at the H level and the L level, and both CG terminal 56 and EV terminal 57 are in the "non-charged" state, then shift register control signal 65 goes to the L level, signal selection circuit 35 selects shift register 32, and input/output switching circuit 31 goes to "output." As a result, trimming is performed using data stored in shift register 32 (Mode No. 3).

When E terminal 55 input is at the L level, DS terminal 53 input is at the L level, CLK terminal 54 input is at the L level, and both CG terminal 56 and EV terminal 57 are in the "non-charged" state, then shift register control signal 65 goes to the L level, signal selection circuit 35 selects EPROM 34, and input/output switching circuit 31 goes to "input." As a result, the semiconductor pressure-sensing device goes into steady state, with trimming being performed using data stored in EPROM 34 (Mode No. 4).

When E terminal 55 input is at the H level, DS terminal 53 input is at the L level, CLK terminal 54 input is at the L level, the 2 bits (A and B) of control data 61 are at the H level, and both CG terminal 56 and EV terminal 57 are in the "non-charged" state, then shift register control signal 65 goes to the L level and input/output switching circuit 31 goes to "output." As a result, data stored in shift register 32 is transferred to EPROM 34 (Mode No. 5).

When E terminal 55 input is at the H level, DS terminal 53 input is at the L level, CLK terminal 54 input is at the L level, the 2 bits (A and B) of control data 61 are at the H level, and both CG terminal 56 and EV terminal 57 are in a state where write voltages are applied, then shift register control signal 65 goes to the L level and input/output switching circuit 31 goes to "output." As a result, data stored in shift register 32 is written into EPROM 34 (Mode No. 6).

When E terminal 55 input is at the H level, DS terminal 53 input is at the L level, CLK terminal 54 input is at the L level, the first bit (A) and second bit (B) of control data 61 are respectively at the L level and the H level, and both CG terminal 56 and EV terminal 57 are in the "non-charged" state, then shift register control signal 65 goes to the H level, signal selection circuit 35 selects EPROM 34, and input/output switching circuit 31 goes to "output." As a result, data stored in EPROM 34 is transferred to shift register 32 (Mode No. 7).

Next, a procedure for performing trimming of semiconductor pressure-sensing device 3 is described. Each terminal of semiconductor pressure-sensing device 3 is set so that when a voltage, which is the operating power supply, for example 5V, is applied through Vcc terminal 52, the semiconductor pressure-sensing device automatically goes into the steady state of above-mentioned Mode No. 4. In an initial state where trimming has not been done, EPROM 34 is in an "all zero" state where nothing has been stored in memory. At this time, the signal amplifier circuit 41 and Vout terminal 58 are in a saturated state, that is, a state at or near either the power supply potential or the ground potential.

Figure 5:
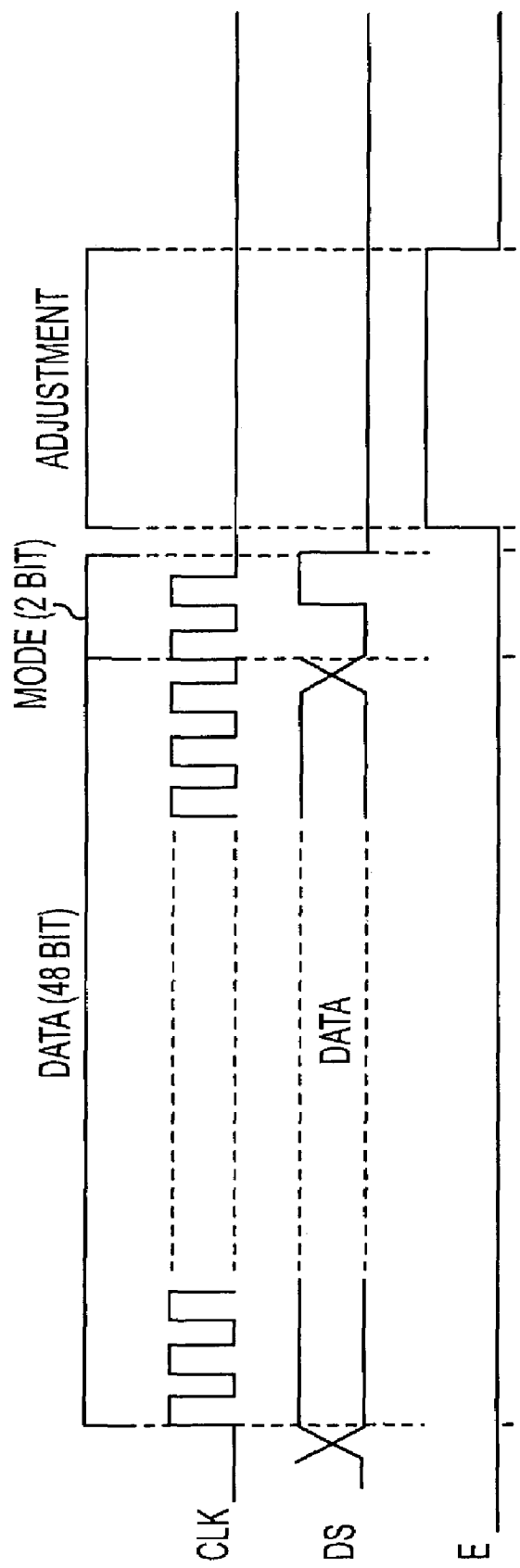
FIG. 5 is a timing chart illustrating an operational timing of a semiconductor pressure-sensing device of the embodiment of the present invention shown in FIG. 2.

As illustrated in the timing chart of FIG. 5, by inputting trimming data from DS terminal 53, while inputting an external clock into CLK terminal 54, and by setting E terminal 55 to the L level, trimming data from the exterior is stored in shift register 32 (Mode No. 1). Then, by setting CLK terminal 54 and DS terminal 53 to the L level, and also setting E terminal 55 to the H level, trimming is done using trimming data stored in shift register 32 (Mode No. 3). At this time, sensor output from Vout terminal 58 is measured. This provisional trimming operation is repeated until the desired sensor output is obtained. In other words, by measuring sensor output while gradually changing the provisional trimming data inputted from outside, trimming data which results in the desired sensor output can be determined.

Figure 6:
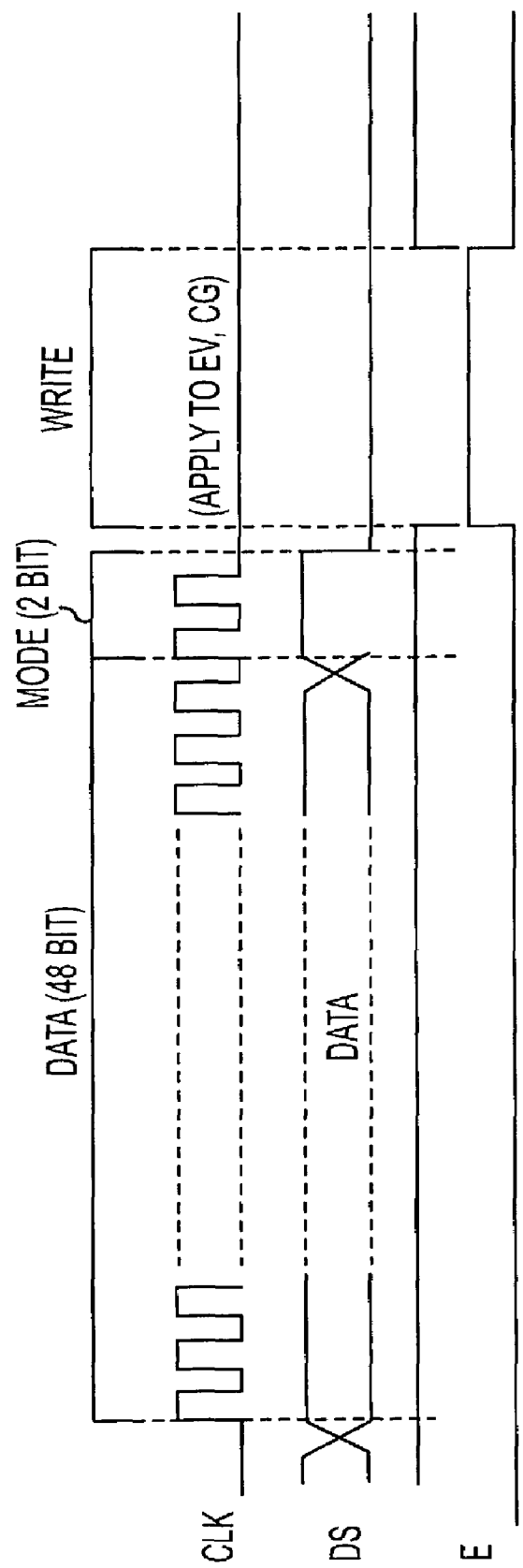
FIG. 6 is a timing chart illustrating an operational timing of a semiconductor pressure-sensing device of the embodiment of the present invention shown in FIG. 2.

Once the trimming data has been determined, finalized trimming data from outside is stored in shift register 32 by inputting the finalized trimming data from DS terminal 53, while inputting an external clock into CLK terminal 54 and setting E terminal 55 to the L level, as in the timing chart shown in FIG. 6 (Mode No. 1). Next, setting E terminal 55 to the H level, DS terminal 53 to the L level and CLK terminal 54 to the L level, finalized trimming data is transferred from shift register 32 to EPROM 34 (Mode No. 5). Afterward, "write" voltages are applied to each of CG terminal 56 and EV terminal 57, and trimming data transferred from shift register 32 is written into EPROM 34 (Mode No. 6).

Upon completion of writing, the trimming operation is finished. Thereafter, semiconductor pressure sensor device 3 is used in its initial state (Mode No. 4). In this way, desired sensor characteristics can always be obtained, based on trimming data stored in EPROM 34.

Figure 7:
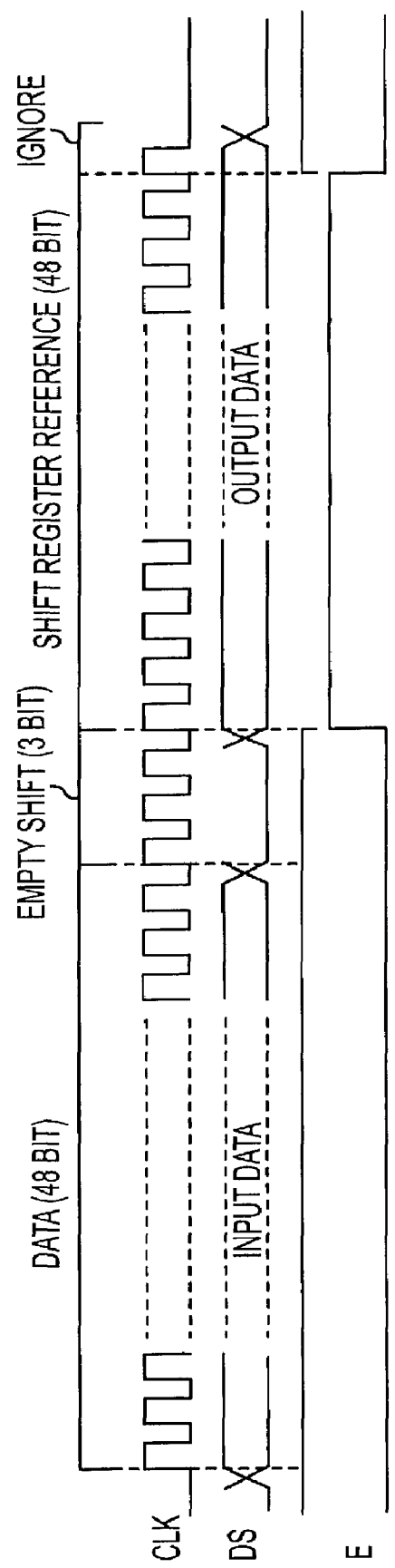
FIG. 7 is a timing chart illustrating an operational timing of a semiconductor pressure-sensing device of the embodiment of the present invention shown in FIG. 2.

In addition, before starting a provisional trimming operation, by inputting provisional trimming data from DS terminal 53, while inputting an external clock into CLK terminal 54 and setting E terminal 55 to the L level, provisional trimming data from the exterior is stored in shift register 32, as illustrated in the timing chart of FIG. 7 (Mode No. 1). Thereafter, if E terminal 55 is set to the H level, the provisional trimming data stored in shift register 32 can be outputted from DS terminal 53 (Mode No. 2). This causes the provisional trimming data inputted from DS terminal 53 to be outputted to DS terminal 53 unchanged, after being routed through input/output switching circuit 31 and shift register 32. As a result, this provides a quality check on the operation of shift register 32 and input/output switching circuit 31. In other words, by executing the timing chart illustrated in FIG. 7, it is possible to perform a quality check on the operation of shift register 32 and input/output switching circuit 31. Furthermore, among the bits of the timing chart illustrated in FIG. 7, those designated "IGNORE" are bits that are not related to trimming adjustment and thus may be ignored. The same is true of FIG. 8 which is discussed later.

Figure 8:
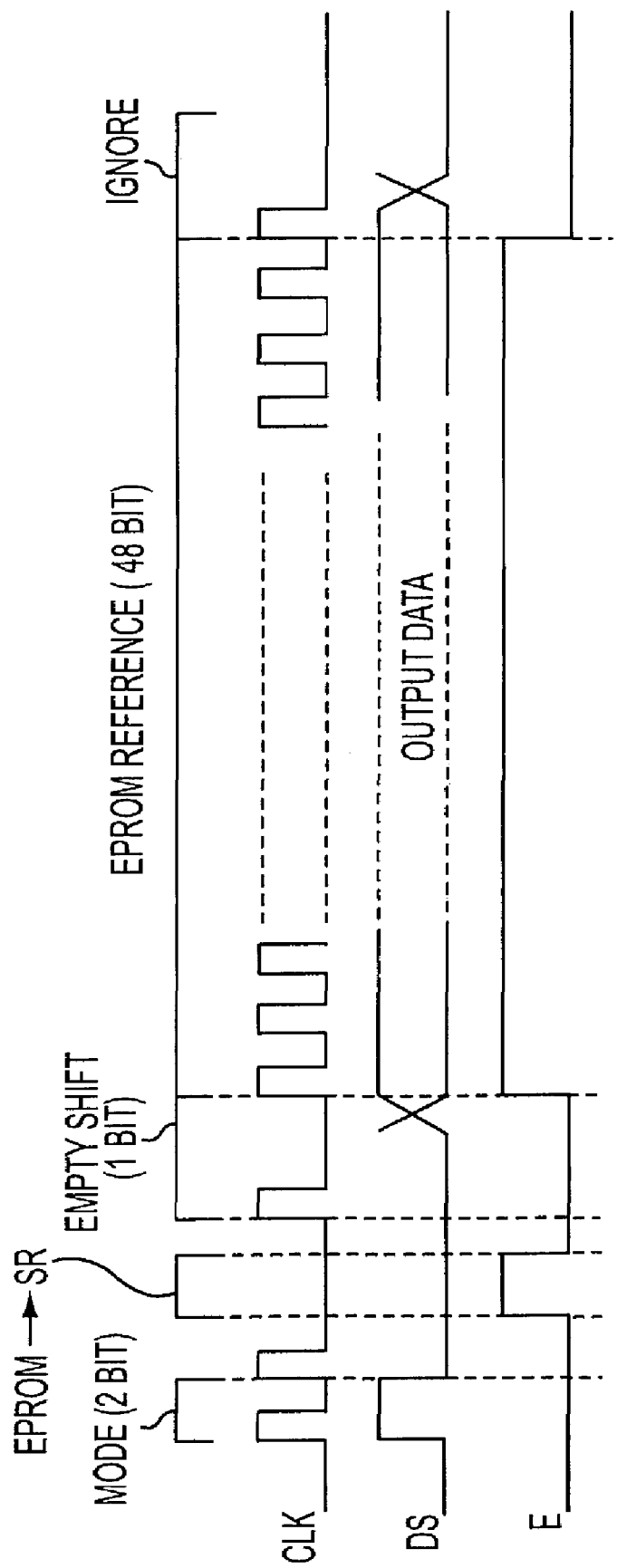
FIG. 8 is a timing chart illustrating an operational timing of a semiconductor pressure-sensing device of the embodiment of the present invention shown in FIG. 2.

In addition, by setting E terminal 55 to the H level, DS terminal 53 to the L level, CLK terminal 54 to the L level, as illustrated in the timing chart of FIG. 8, trimming data stored in EPROM 34 can be transferred to shift register 32 (Mode No. 7). After transfer, if E terminal 55 is set to the H level while inputting an external clock to CLK terminal 54, the trimming data stored in shift register 32 can be outputted from DS terminal 53 (Mode No. 2). In this manner, trimming data stored in EPROM 34 can be outputted from DS terminal 53, thus making it possible to check EPROM 34 operation quality, examine EPROM 34 data holding capacity, and study sources of trouble with sensor characteristics after trimming. This is very effective for quality assurance and quality control of semiconductor pressure sensor devices 3.

Figure 9:
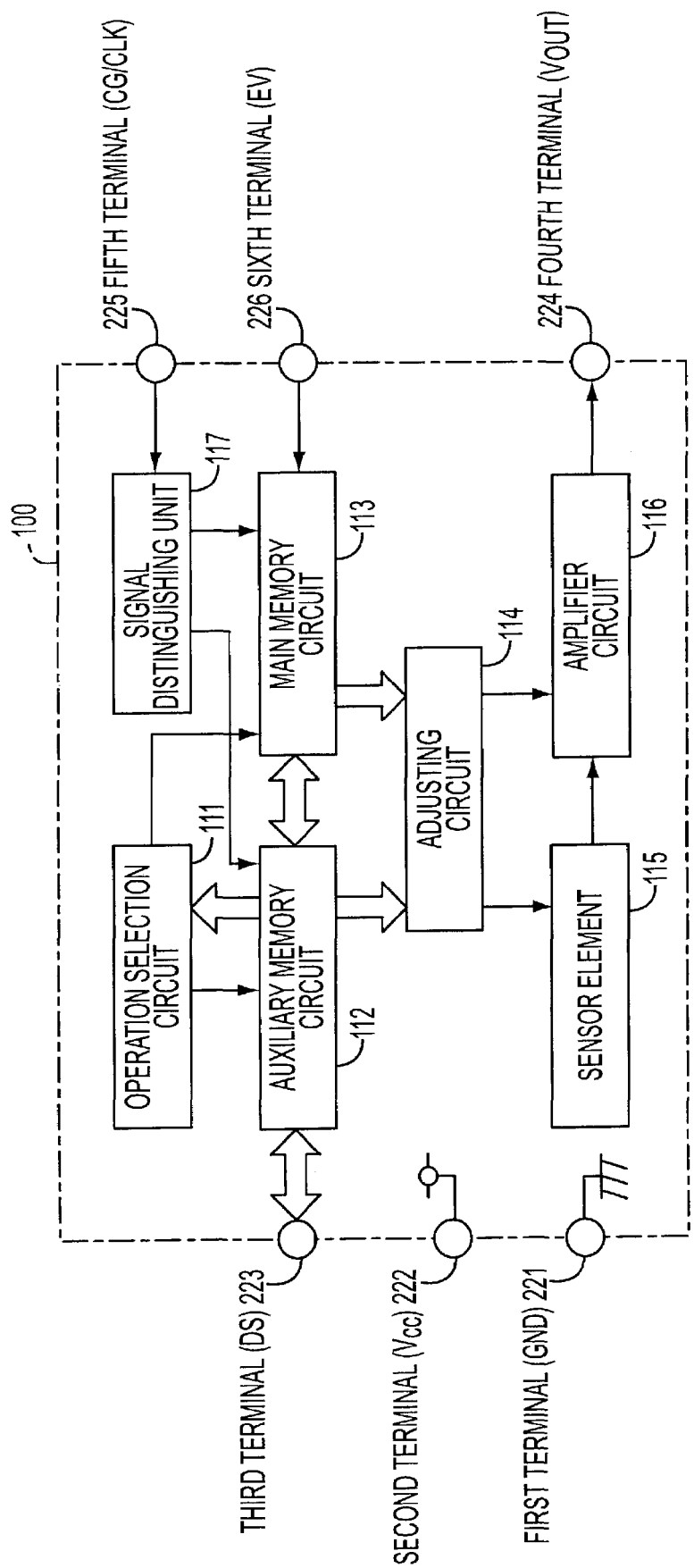
FIG. 9 is a block diagram illustrating a semiconductor physical quantity sensing device according to a second embodiment of the present invention.

FIG. 9 is a block diagram illustrating a semiconductor physical quantity sensing device, according to a second embodiment of the present invention. In FIG. 9, the semiconductor physical quantity sensing device 100 includes operation selection circuit 111, auxiliary memory circuit 112, main memory circuit 113, adjusting circuit 114, sensor element 115, such as a Wheatstone bridge circuit, amplifier circuit 116, signal distinguishing unit 117, and six terminals (first terminal 221 through sixth terminal 226).

First terminal 221 is a ground terminal that supplies the ground potential to semiconductor physical quantity sensing device 100. Second terminal 222 is a power supply terminal that supplies a power supply voltage to semiconductor physical quantity sensing device 100. Serial digital data (hereinafter referred to simply as "serial data" ) is inputted to and outputted from semiconductor physical quantity sensing device 100 through third terminal (data input terminal) 223. Fourth terminal 224 is an output terminal, through which the signal from semiconductor physical quantity sensing device 100 is outputted to the outside. Fifth terminal 225 is a first write terminal that supplies a voltage higher than the power supply voltage applied to second terminal 222 to semiconductor physical quantity sensing device 100. An external clock is also supplied through fifth terminal 225. Sixth terminal 226 is a second write terminal that supplies a voltage higher than the power supply voltage applied to second terminal 222, and different from the voltage applied to fifth terminal 225 to semiconductor physical quantity sensing device 100.

According to an operation timing, based on the above described external clock, auxiliary memory circuit 112 converts a supplied serial data into parallel digital data (hereinafter referred to simply as "parallel data" ) that will be used internally. In addition, auxiliary memory circuit 112 converts the parallel data used internally into serial data for outputting to the outside. Furthermore, auxiliary memory circuit 112 supplies control data to operation selection circuit 111. In accordance with the voltages applied to fifth and sixth terminals 225 and 226, main memory circuit 113 stores trimming data, including the parallel data supplied from auxiliary memory circuit 112.

Based on the control data supplied from auxiliary memory circuit 112, operation selection circuit 111 supplies a control signal for controlling the data input and data output of auxiliary memory circuit 112 and main memory circuit 113. Sensor element 115 generates an output signal indicative of the physical quantity of a medium being measured. Amplifier circuit 116 amplifies the output signal from sensor element 115 and supplies the amplified signal to the outside via fourth terminal 224. Based on the trimming data supplied from auxiliary memory circuit 112 or main memory circuit 113, adjusting circuit 114 adjusts the sensitivity of sensor element 115 considering the temperature characteristics of sensor element 115. Adjusting circuit 114 also performs offset adjustments for amplifier circuit 116 considering the temperature characteristics of amplifier circuit 116.

Signal distinguishing unit 117 distinguishes whether the voltage applied to fifth terminal 225 is an external clock supplied from the outside or a write voltage for writing trimming data into main memory circuit 113. When the voltage applied to fifth terminal 225 is an external clock, signal distinguishing unit 117 supplies the external clock to auxiliary memory circuit 112. When the voltage applied to fifth terminal 225 is write voltage, signal distinguishing unit 117 supplies the write voltage to main memory circuit 113.

Figure 10:
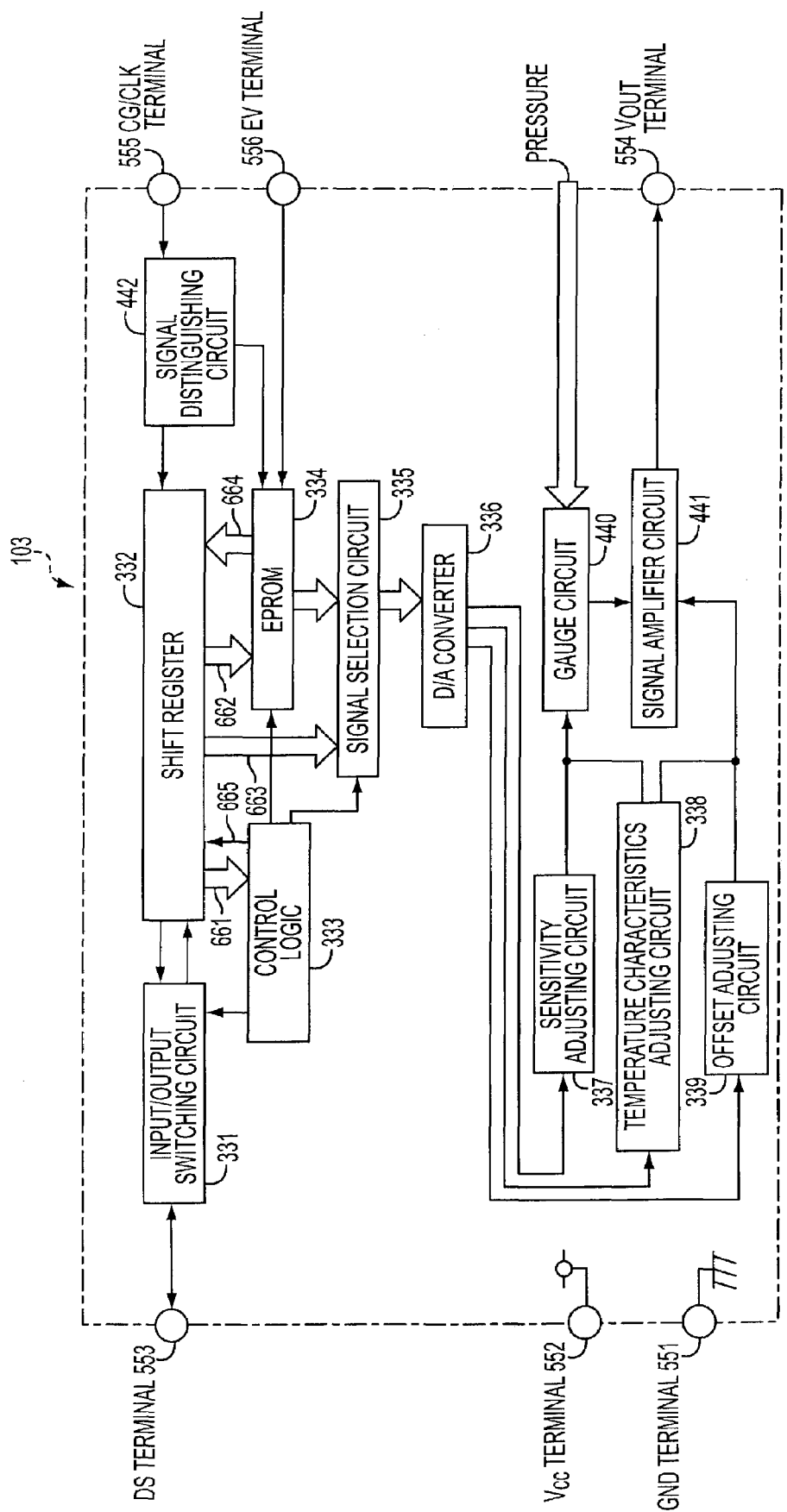
FIG. 10 is a block diagram illustrating a semiconductor pressure-sensing device formed on a semiconductor chip according to the second embodiment of the present invention.

FIG. 10 is a block diagram illustrating a semiconductor pressure-sensing device formed on a semiconductor chip according to the second embodiment of the invention. The semiconductor pressure-sensing device 103, according to the second embodiment, includes a digital circuit section including input/output switching circuit 331, shift register 332, control logic 333, EPROM 334, signal selection circuit 335, D/A converter 336, and signal distinguishing circuit 442. The semiconductor pressure-sensing device 103 also includes an analog circuit section including sensitivity adjusting circuit 337, temperature characteristics adjusting circuit (hereinafter referred to as "TC adjusting circuit") 338, offset adjusting circuit 339, gauge circuit 440, and signal amplifier circuit 441.

Input/output switching circuit 331, shift register 332, control logic 333, EPROM 334, signal selection circuit 335, D/A converter 336, signal distinguishing circuit 442, sensitivity adjusting circuit 337, TC adjusting circuit 338, offset adjusting circuit 339, gauge circuit 440, and signal amplifier circuit 441 can be formed on the same semiconductor chip and configured only from active and passive elements which are manufactured through a CMOS manufacturing process. Semiconductor pressure-sensing device 103 is provided with GND terminal 551, Vcc terminal 552, DS terminal 553, Vout terminal 554, CG/CLK terminal 555 and EV terminal 556, for receiving power from the outside and for transferring signals to and from the outside.

GND terminal 551 supplies the ground potential to semiconductor pressure-sensing device 103. Vcc terminal 552 supplies a power supply voltage of, for example, 5 V, although not always limited thereto. DS terminal 553 is a terminal, through which serial data can be exchanged between semiconductor pressure-sensing device 103 and circuits (not shown) outside semiconductor pressure-sensing device 103. Vout terminal 554 outputs the detection signal of semiconductor pressure-sensing device 103 to the outside.

When data is being written into EPROM 334, a voltage, higher than the power supply voltage applied to Vcc terminal 552, for example 26 V, is applied to CG/CLK terminal 555 as a first write voltage. An external clock for driving shift register 332 is also fed to CG/CLK terminal 555. When data is being written into EPROM 334, a voltage higher than the power supply voltage applied to Vcc terminal 552 and different from the voltage applied to CG/CLK terminal 555, for example 13 V, is applied to EV terminal 556 as a second write voltage.

Input/output switching circuit 331 switches between a mode that supplies the trimming data, including serial data supplied from the outside via DS terminal 553, to shift register 332 and a mode that outputs serial data supplied from shift register 332 to the outside via DS terminal 553. In synchronism with the external clock, shift register 332 converts the serial data supplied from the outside to parallel data. Shift register 332 also converts the trimming data, including parallel data stored in EPROM 334, to serial data. Shit register 332 exhibits the functions of auxiliary memory circuit 112.

EPROM 334 stores the trimming data including parallel data supplied from shift register 332. When the trimming data is being written into EPROM 334, the first and second write voltages are applied to EPROM 334. EPROM 334 exhibits the functions of main memory circuit 113. Signal selection circuit 335 selects any of the trimming data including parallel data supplied from shift register 332 and the trimming data including parallel data supplied from EPROM 334 and supplies the selected trimming data to D/A converter 336. D/A converter 336 converts the selected trimming data, including parallel data, to analog data.

Based on the control data supplied from shift register 332, control logic circuit 333 generates and outputs control signals for controlling input/output switching circuit 331, shift register 332, EPROM 334, and signal selection circuit 335. Hereinafter, the control signal supplied from control logic 333 to shift register 332 will be referred to as the "shift register control signal 665" or in short "SR control signal 665." Input/output switching circuit 331, control logic circuit 333 and signal selection circuit 335 exhibit the functions of operation selection circuit 111 collectively.

Signal distinguishing circuit 442 distinguishes whether the voltage applied to CG/CLK terminal 555 is the voltage indicating the external clock or the first write voltage for writing trimming data into EPROM 334. Signal distinguishing circuit 442 supplies the external clock to shift register 332 and the first write voltage to EPROM 334. Signal distinguishing circuit 442 exhibits the functions of signal distinguishing unit 117.

Figure 11:
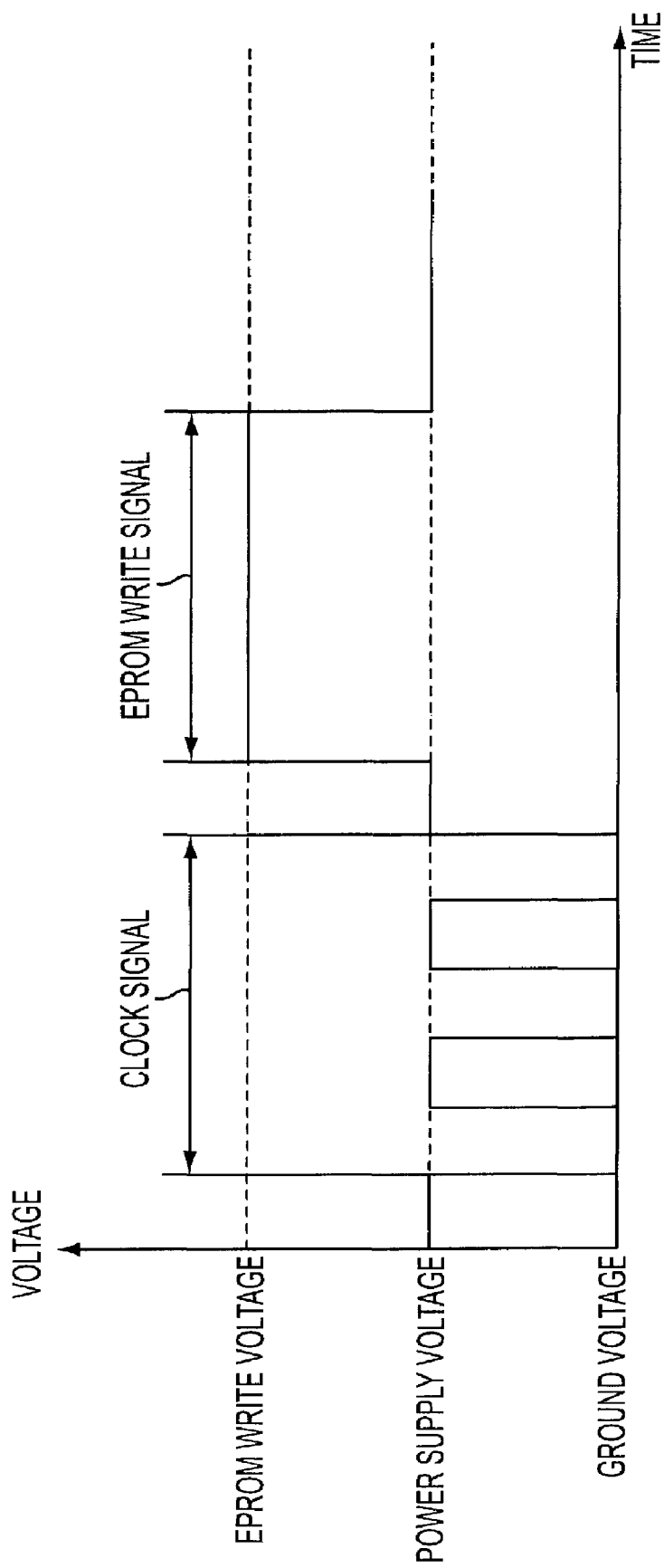
FIG. 11 is a diagram for explaining the principle of distinguishing an external clock and a write voltage applied to an EPROM.

If described generally, the clock is formed of two voltage levels between the power supply voltage and the ground voltage. Usually, the voltage necessary for writing data into EPROM 334 is higher than the power supply voltage. EPROM 334 does no react to data writing when the voltage applied thereto is lower than the power supply voltage. Therefore, the power supply voltage is used as a reference voltage for distinguishing between the clock and the write voltage. As illustrated in FIG. 11, for example, the voltage applied to CG/CLOCK terminal 555, lower than the power supply voltage, is the external clock, and the voltage applied to CG/CLOCK terminal 555, higher than the power supply voltage, is the first write voltage.

Gauge circuit 440 can be configured from a semiconductor strain gauge that generates an output signal responsive to the applied pressure. Signal amplifier circuit 441 amplifies the signal generated in gauge circuit 440 and outputs the amplified signal to the outside via Vout terminal 554. Sensitivity adjusting circuit 337 changes and adjusts (trims) the current fed to gauge circuit 440 according to the output from D/A converter 336. Similarly, offset adjusting circuit 339 trims the reference voltage for adjusting the offset of signal amplifier circuit 441, according to an output from D/A converter 336. TC adjusting circuit 338 performs addition and subtraction to the outputs of sensitivity adjusting circuit 337 and offset adjusting circuit 339 according to the output from D/A converter 336.

D/A converter 336, sensitivity adjusting circuit 337, TC adjusting circuit 338, and offset adjusting circuit 339 work as adjusting circuit 114, collectively, gauge circuit 440 works as sensor element 115, and signal amplifier circuit 441 works as amplifier circuit 116. GND terminal 551, Vcc terminal 552, DS terminal 553, Vout terminal 554, CG/CLK terminal 555, and Ev terminal 556 correspond to the first through sixth terminals 221 through 226, respectively.

Figure 12:
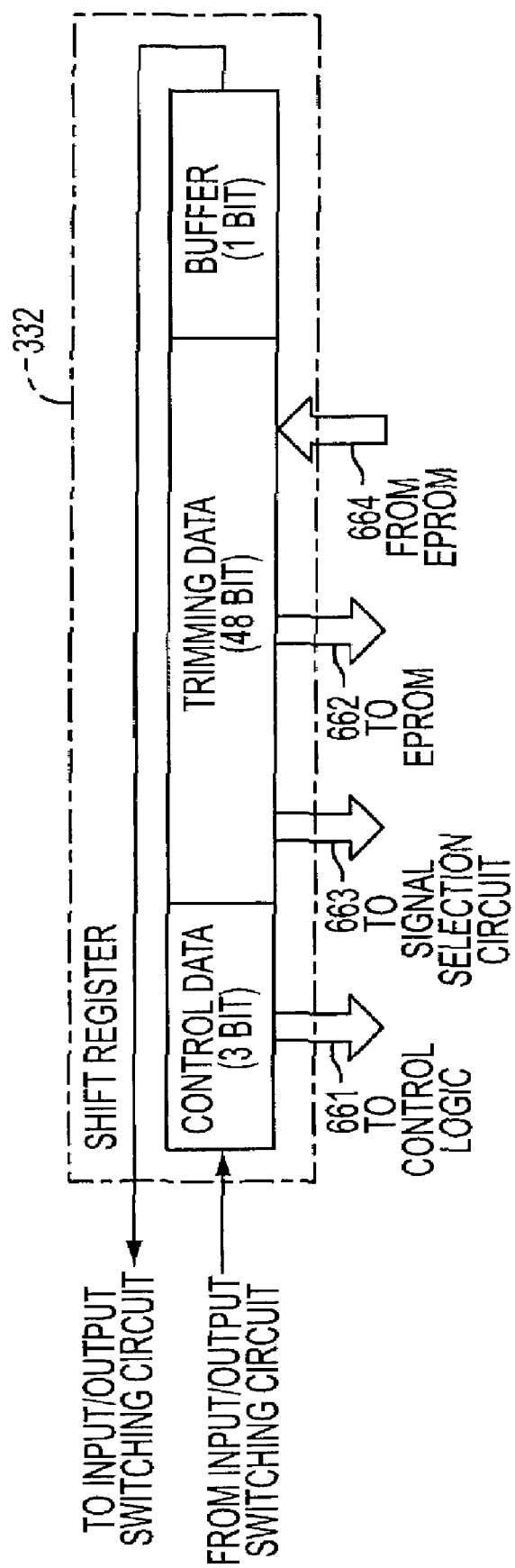
FIG. 12 is a diagram illustrating an example of a shift register configuration in the pressure-sensing device of the embodiment of the present invention shown in FIG. 10.

FIG. 12 is a diagram schematically illustrating an example of a shift register configuration in the pressure-sensing device having the configuration illustrated in FIG. 10. The bit count of shift register 332 is 52 bits, for example. Of these, three bits store control data 661 supplied to control logic 333. Forty eight bits subsequent to the above described three bits are used to store trimming data 662 supplied to EPROM 334, trimming data 663 supplied to signal selection circuit 335 or data 664 supplied from EPROM 334. The remaining one bit can be used as a buffer.

Now various control signals, and the relations between applied voltages and the operation modes of semiconductor pressure-sensing device 103, will be described below with reference to FIG. 13. When an external clock is inputted to CG/CLK terminal 555, EV terminal 556 is in a "non-connection (NC) state", the two bits A and B of control data 661 are at the L level, the enable bit C of control data 661 is at the L level, and serial data is inputted to DS terminal 553. Then SR control signal 665 is set at the L level, signal selection circuit 335 selects EPROM 334 and input/output switching circuit 331 switches to "input." As a result, serial data is inputted to shift register 332 from the outside (Mode No. 1).

When an external clock is inputted to CG/CLK terminal 555, EV terminal 556 is in a "non-connection (NC) state", the two bits A and B of control data 661 are at the L level, and the enable bit C of control data 661 is at the H level. Then the SR control signal 665 is set at the L level, signal selection circuit 335 selects EPROM 334 and input/output switching circuit 331 switches to "output." As a result, serial data is outputted from shift register 332 to the outside (Mode No. 2).

When the enable bit C of control data 661 is at the H level, the input of DS terminal 553 is at the L level, the input of CG/CLK terminal 555 is at the L level, the first bit A of control data 661 is at the H level, the second bit B of control data 661 is at the L level, and EV terminal 556 is in the NC state. Then SR control signal 665 is set at the L level, signal selection circuit 335 selects shift register 332 and input/output switching circuit 331 switches to "output." As a result, trimming is performed using the data stored in shift register 332 (Mode No. 3).

When the enable bit C of control data 661 is at the L level, the input of DS terminal 553 is at the L level, the input of CG/CLK terminal 555 is at the L level, and EV terminal 556 is in the NC state. Then RS control signal 665 is set at the L level, signal selection circuit 335 selects EPROM 334 and input/output switching circuit 331 switches to "input." As a result, trimming is performed using the data stored in EPROM 334 (Mode No. 4).

When the enable C of control data 661 is at the H level, the input of DS terminal 553 is at the L level, the input of CG/CLK terminal 555 is at the L level, the two bits A and B of control data 661 are at the H level, and EV terminal 556 is in the NC state. Then SR control signal 665 is set at the L level and input/output switching circuit 331 switches to "output." As a result, the data stored in shit register 332 is transferred to EPROM 334 (Mode No. 5).

When the enable bit C of control data 661 is at the H level, the input of DS terminal 553 is at the L level, the two bits A and B of control data 661 are at the H level, and a write voltage is applied to CG/CLK terminal 555 and EV terminal 556. Then SR control signal 665 is set at the L level and input/output switching circuit 331 switches to "output." As a result, the data stored in shit register 332 is written into EPROM 334 (Mode No. 6).

When the enable bit C of control data 661 is at the H level, the input of DS terminal 553 is at the L level, the input of CG/CLK terminal 555 is at the L level, the first bit A of control data 661 is at the L level, the second bit B of control data 661 is at the H level, and EV terminal 556 is in the NC state. Then SR control signal 665 is set at the H level, signal selection circuit 335 selects EPROM 334 and input/output switching circuit 331 switches to "output." As a result, the data stored in EPROM 334 is transferred to shit register 332 (Mode No. 7).

Now the trimming procedure for semiconductor pressure-sensing device 103 will be described below. Each terminal of semiconductor pressure-sensing device 103 is set such that semiconductor pressure-sensing device 103 is automatically in the steady state of above described Mode No. 4 when the power supply voltage of, for example, 5 V is applied through Vcc terminal 552. In the initial state, in which trimming has not been performed yet, EPROM 334 is in an "all zero" state, in which nothing has been stored therein. At this time, signal amplifier circuit 441 and Vout terminal 554 are in a saturated state, that is, signal amplifier circuit 441 and Vout terminal 554 are biased at any of, or near any of, the power supply potential and the ground potential.

Figure 14:
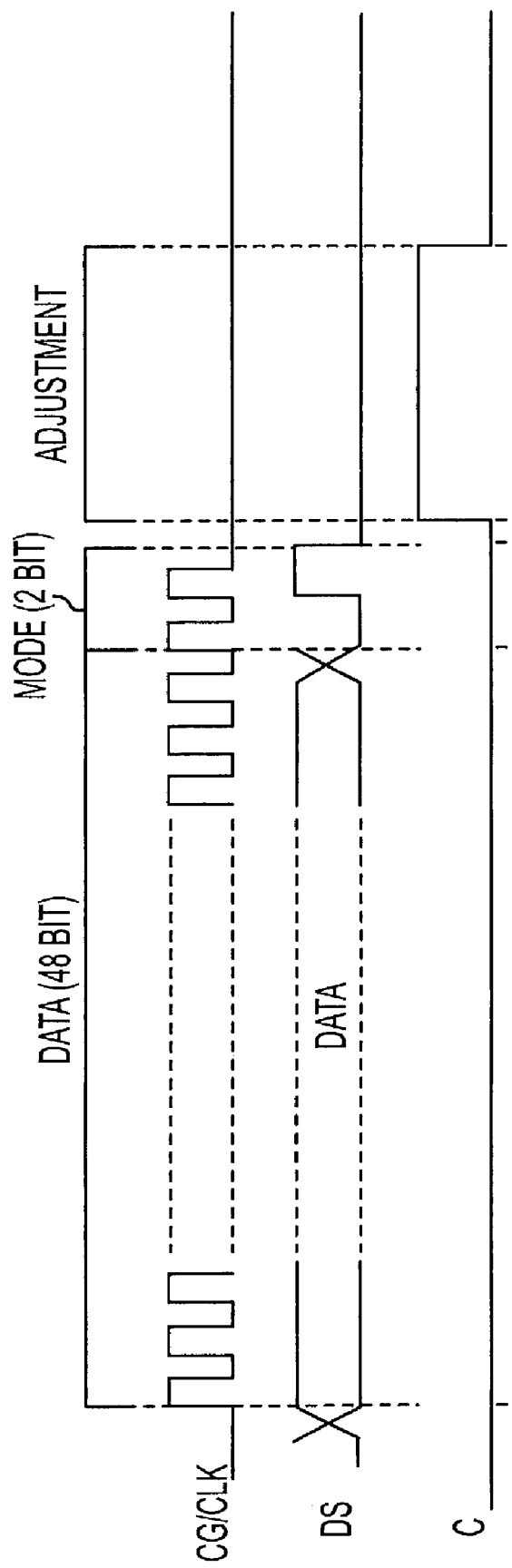
FIG. 14 is a timing chart illustrating an operation timing of the pressure-sensing device of the embodiment of the present invention shown in FIG. 10.

As illustrated in the timing chart of FIG. 14, trimming data is stored in shift register 332 from the outside by inputting the trimming data through DS terminal 553 and by setting the enable bit C of control data 661 at the L level while inputting an external clock to CG/CLK terminal 555 (Mode No. 1). Then, trimming is conducted using the trimming data stored in shift register 332 by setting CG/CLK terminal 555 and DS terminal 553 at the L level and by setting the enable bit C of control data 661 at the H level (Mode No. 3).

At this time, the sensor output from Vout terminal 554 is measured. This provisional trimming operation is repeated until the desired sensor output is obtained. In other words, trimming data which results in the desired sensor output is determined by measuring sensor output while gradually changing the provisional trimming data inputted from the outside.

Figure 15:
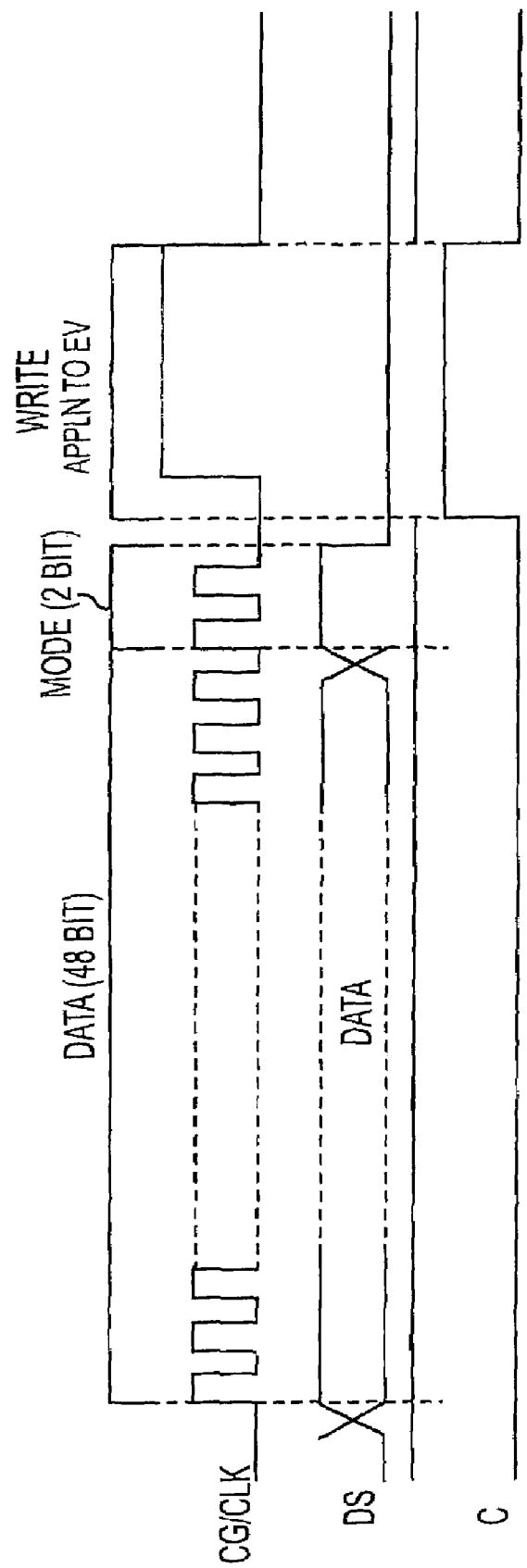
FIG. 15 is a timing chart illustrating another operation timing of the pressure-sensing device of the embodiment of the present invention shown in FIG. 10.

Once trimming data has been determined, the determined trimming data is stored in shift register 332, from the outside, by inputting the determined trimming data through DS terminal 553 and by setting the enable bit C of control data 661 at the L level while inputting an external clock to CG/CLK terminal 555, as described in the timing chart of FIG. 15 (Mode No. 4). Then, the determined trimming data is transferred from shift register 332 to EPROM 334 by setting the enable bit C of control data 661 at the H level, DS terminal 553 at the L level, and CG/CLK terminal 555 at the L level (Mode No. 5). Then, the determined trimming data transferred from shift register 332 is written into EPROM 334 by applying a write voltage to CG/CLK terminal 555 and EV terminal 556 (Mode No. 6).

Upon completion of writing, the trimming operation is finished. Thereafter, semiconductor pressure-sensing device 103 is used in the initial state thereof (Mode No. 4). In this way, the desired sensor characteristics adjusted based on the trimming data stored in EPROM 334 are obtained.

Figure 16:
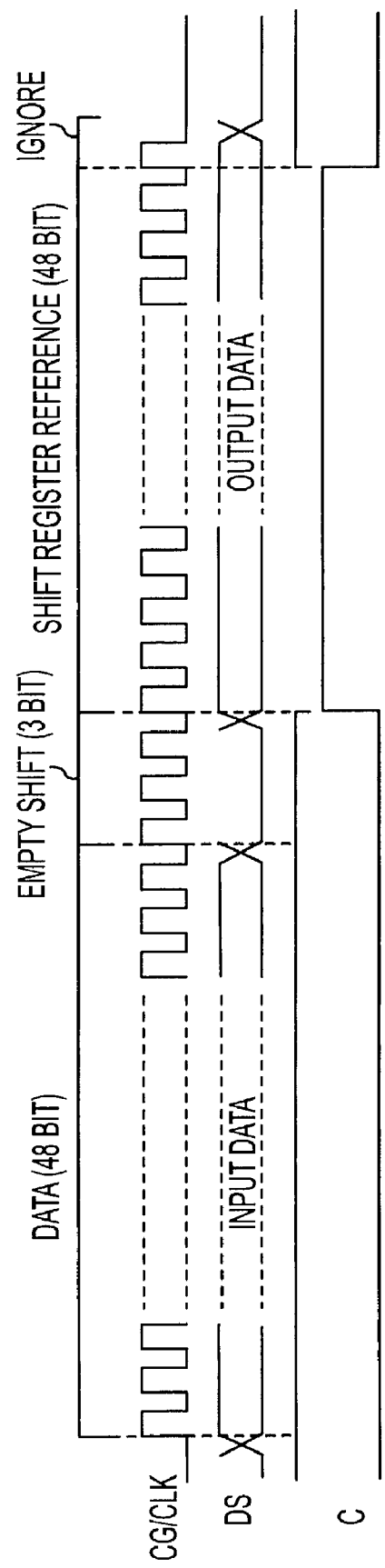
FIG. 16 is a timing chart illustrating still another operation timing of the pressure-sensing device of the embodiment of the present invention shown in FIG. 10.

In addition, provisional trimming data is stored in shift register 332 from the outside, before provisional trimming starts, by inputting the provisional trimming data through DS terminal 553 and by setting the enable bit C of control data 661 at the L level, while inputting an external clock to CG/CLK terminal 555, as illustrated in the timing chart of FIG. 16 (Mode No. 1). Then, the provisional trimming data stored in shift register 332 is outputted from DS terminal 553 by setting the enable bit C of control data 661 at the H level (Mode No. 2).

Since this operation outputs the provisional trimming data inputted through DS terminal 553 to DS terminal 553 without being changed after routing the inputted provisional trimming data through input/output switching circuit 331 and shift register 332, this operation facilitates performing a quality check on the operations of shift register 332 and input/output switching circuit 331. In other words, it is possible to perform a quality check on the operations of shift register 332 and input/output switching circuit 331 by executing the timing chart illustrated in FIG. 16. Among the bits in the timing chart of FIG. 16, the bits designated "IGNORE" are the bits that are not pertinent to trimming and, therefore, may be ignored. The same is true of FIG. 17, which will be discussed later.

Figure 17:
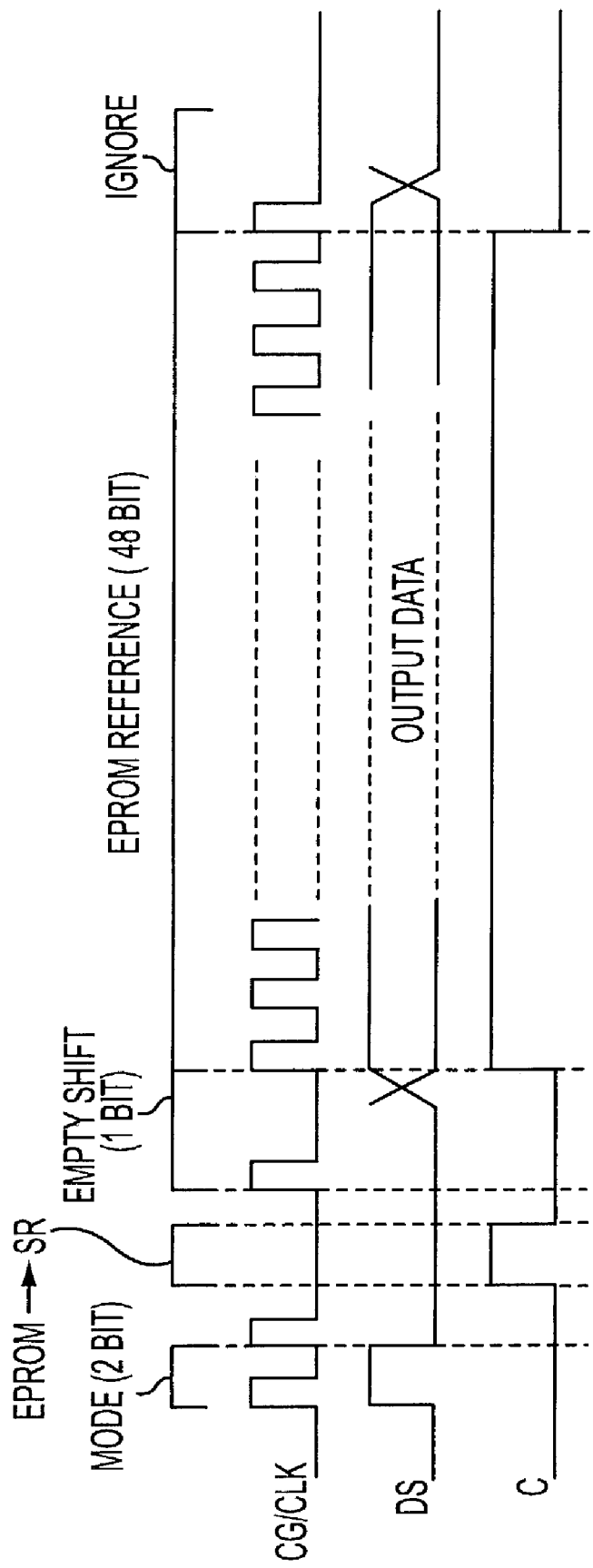
FIG. 17 is a timing chart illustrating a further operation timing of the pressure-sensing device of the embodiment of the present invention shown in FIG. 10.

As illustrated in the timing chart of FIG. 17, it is possible to transfer the trimming data stored in EPROM 334 to shift register 332 by setting the enable bit C of control data 661 at the L level, DS terminal 553 at the L level, and CG/CLK terminal 555 at the L level (Mode No. 7). After the transfer, it is also possible to output the trimming data stored in shift register 332 from DS terminal 553 by setting the enable bit C of control data 661 at the H level while inputting an external clock to CG/CLK terminal 555 (Mode No. 2). Since it is possible to output the trimming data stored in EPROM 334 through DS terminal 553 as described above, it is possible to check the operation quality of EPROM 334, to examine the data holding capability of EPROM 334 and to investigate the causes of the troubles with the sensor characteristics after trimming. This is very effective for quality assurance and quality control of semiconductor pressure-sensing device 103.

As described above, the semiconductor physical quantity sensing device, according to the second embodiment, measures the sensor output while gradually changing the provisional trimming data stored in shift register 332 to determine a trimming data that obtains the desired sensor putout, stores the determined trimming data in EPROM 334, and adjusts, in the normal state of using, the sensor output by sensitivity adjusting circuit 337, temperature characteristics adjusting circuit 338, and offset adjusting circuit 339 using the trimming data stored in EPROM 334. The semiconductor physical quantity sensing device according to the second embodiment may be formed only of constituent active elements and constituent passive elements manufactured through the CMOS manufacturing process and formed on one single semiconductor chip together with six terminals 551 through 556. Therefore, the semiconductor physical quantity sensing device according to the second embodiment facilitates performing electric trimming with low costs and with a small number of terminals.

Figure 18:
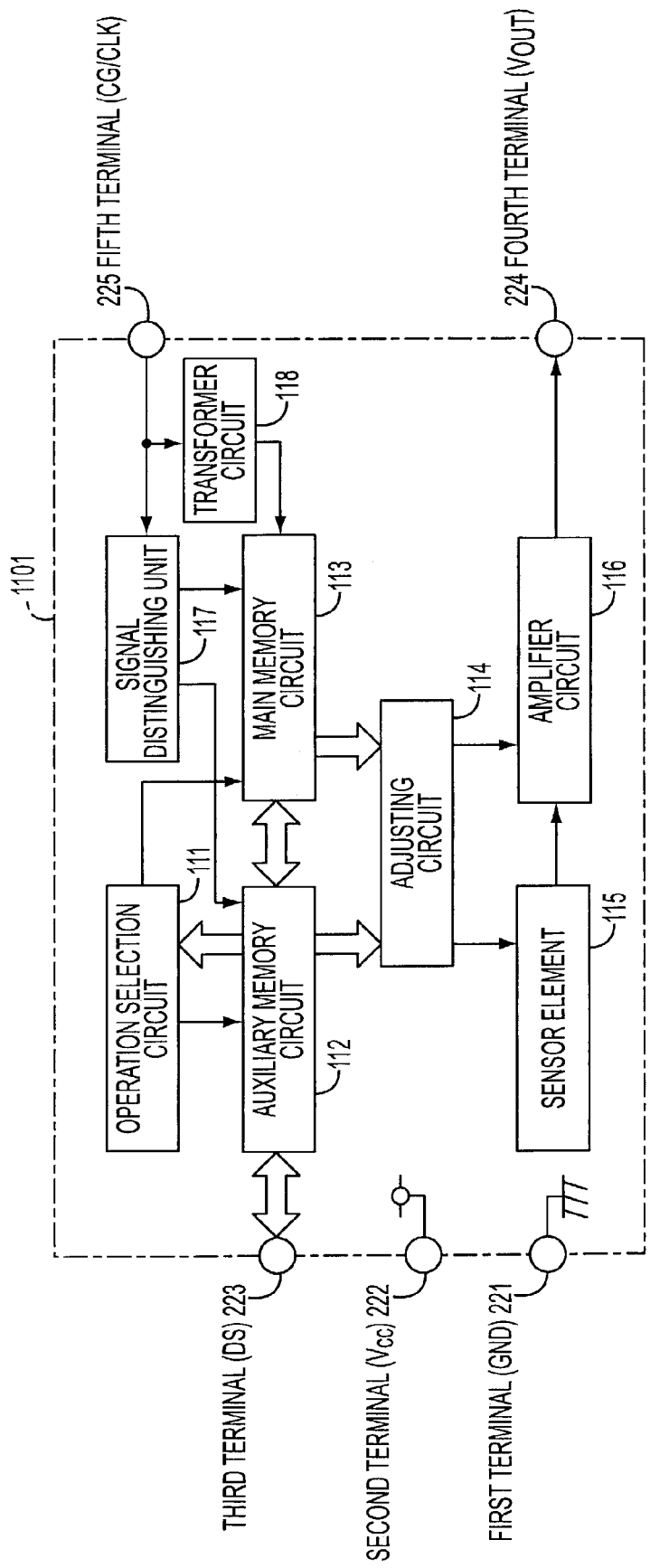
FIG. 18 is a block diagram illustrating a semiconductor physical quantity sensing device according to a third embodiment of the present invention.

FIG. 18 is a block diagram illustrating a semiconductor physical quantity sensing device according to a third embodiment of the present invention. As illustrated in FIG. 18, semiconductor physical quantity sensing device 1101, according to the third embodiment, generates a voltage higher than the power supply voltage applied to second terminal 222, and different from the voltage applied to fifth terminal 225, by transforming the voltage applied to fifth terminal 225 with transformer circuit 118, and feeds the generated voltage and the voltage applied to fifth terminal 225 to main memory circuit 113 thereof.

Therefore, semiconductor physical quantity sensing device 1101, according to the third embodiment, does not include sixth terminal 226 that semiconductor physical quantity sensing device 100 according to the second embodiment can use for supplying the voltage higher than the power supply voltage applied to second terminal 222 and different from the voltage applied to fifth terminal 225. Since the other configurations are the same with those in FIG. 9, the same reference numerals as used in FIG. 9 are used in FIG. 18 to designate the same constituent elements, with their explanations being omitted for the sake of simplicity.

Figure 19:
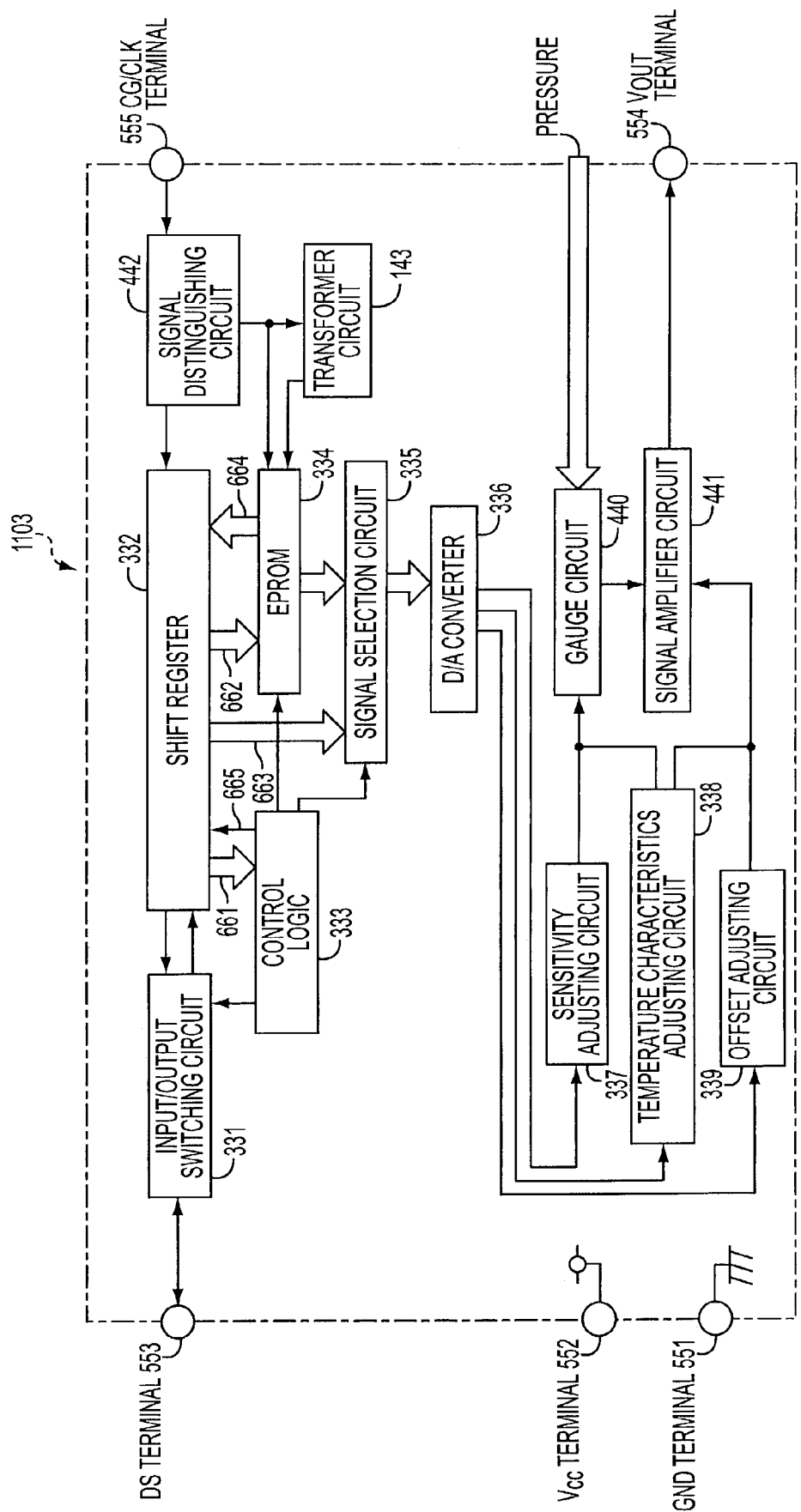
FIG. 19 is a block diagram illustrating a semiconductor pressure-sensing device formed on a semiconductor chip according to the third embodiment of the invention.

FIG. 19 is a block diagram illustrating a semiconductor pressure-sensing device formed on a semiconductor chip according to the third embodiment of the invention. As illustrated in FIG. 19, semiconductor pressure-sensing device 1103 transforms a first write voltage of, for example, 26 V applied to CG/CLK terminal 555 with transformer circuit 143 to generate a second write voltage of, for example, 13 V. The first write voltage is supplied to transformer circuit 143 via signal distinguishing circuit 442. Semiconductor pressure-sensing device 1103 does not include EV terminal 556 that semiconductor pressure-sensing device 103 according to the second embodiment can include.

The first write voltage may be set, for example, at 26 V and the second write voltage may be obtained by stepping down the first write voltage to, for example, 13 V with transformer circuit 143, or vice versa. Since the other configurations are the same with those in FIG. 10, the same reference numerals as used in FIG. 10 are used in FIG. 19 to designate the same constituent elements, with their explanations being omitted for the sake of simplicity. Since the operations and the trimming procedure of semiconductor pressure-sensing device 1103, according to the third embodiment, are the same as those of semiconductor pressure-sensing device 103 according to the second embodiment except that the second write voltage is generated based on the first write voltage in semiconductor pressure-sensing device 1103, the explanations of the operations and the trimming procedure of semiconductor pressure-sensing device 1103 are omitted.

The physical quantity sensing device according to the third embodiment exhibits the same effect as the physical quantity sensing device according to the first embodiment, with less terminals than those in the physical quantity sensing device according to the second embodiment.

According to the above-mentioned embodiments, by measuring sensor output while gradually changing the provisional trimming data stored in shift register 32, trimming data, which results in the desired sensor output, is determined and stored in EPROM 34, and in a normal operating state, sensor output is adjusted by sensitivity adjusting circuit 37, TC adjusting circuit 38 and offset adjusting circuit 39, using trimming data stored in EPROM 34. Because each of these configuration elements is formed only of active elements and passive elements manufactured by the CMOS manufacturing process and because, moreover, these elements together with five to eight terminals are formed on the same semiconductor chip, a semiconductor physical quantity sensing device is obtained which can perform electric trimming cheaply and with a small number of terminals.

The present invention, as described above, need not be limited to semiconductor pressure-sensing devices, but can be applied to sensing devices for a variety of physical quantities, such as temperature, humidity, speed, acceleration, light, magnetism or sound.

According to the present invention, the configuration is such that, by measuring sensor output while gradually changing the provisional trimming data stored in an auxiliary memory circuit, trimming data which results in the desired sensor output is determined and stored in a main memory circuit, and in a normal operating state, sensor output is adjusted by way of adjusting circuit(s), using trimming data stored in the main memory circuit. Because the sensor element, auxiliary memory circuit, main memory circuit and adjusting circuit(s) are formed only of active elements and passive elements manufactured by the CMOS manufacturing process and because, moreover, these elements together with the five to eight terminals are formed on the same semiconductor chip, a semiconductor physical quantity sensing device is obtained which can perform electric trimming cheaply and with a small number of terminals.

Although only a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A semiconductor physical quantity sensing device, comprising:
    a sensor element to generate an electric signal responsive to a detected physical quantity;
    an output terminal to output to the exterior the electric signal generated by the sensor element;
    a data input terminal to input serial digital data;
    an auxiliary memory circuit to temporarily store trimming data, for adjusting output characteristics of the sensor element, inputted from the data input terminal;
    a re-writable read-only main memory circuit to store, by way of an electrical re-write action, the trimming data stored in said auxiliary memory circuit;
    an adjusting circuit to adjust the output characteristic of the sensor element based on trimming data stored in the auxiliary memory circuit or trimming data stored in the main memory circuit,
    operation of the semiconductor physical quantity sensing device being configured to include active and passive elements formed on the same semiconductor chip and manufactured only by a CMOS manufacturing process, and
    an operation selection circuit to control operation of the auxiliary memory circuit and the main memory circuit based partly on digital data stored by the auxiliary memory circuit.

2. The semiconductor physical quantity sensing device of claim 1, wherein the auxiliary memory circuit converts inputted serial digital data to parallel digital data and supplies the converted data to circuits within the semiconductor physical quantity sensing device.

3. The semiconductor physical quantity sensing device of claim 1, having a sensitivity adjusting circuit to perform change/adjustment of current applied to the sensor element based on the trimming data to set a sensitivity of the sensor element.

4. The semiconductor physical quantity sensing device of claim 3, further comprising a temperature characteristics adjusting circuit to perform an addition/subtraction in respect to an output of said sensitivity adjusting circuit.

5. The semiconductor physical quantity sensing device of claim 2, having a sensitivity adjusting circuit to perform change/adjustment of current applied to the sensor element based on the trimming data to set a sensitivity of the sensor element.

6. The semiconductor physical quantity sensing device of claim 1, further comprising an amplifier circuit to amplify and output the electric signal generated by the sensor element, wherein the adjusting circuit further includes an offset adjusting circuit to change/adjust a reference voltage for offset adjustment of the amplifier circuit.

7. The semiconductor physical quantity sensing device of claim 6, wherein the adjusting circuit further includes a temperature characteristics adjusting circuit to perform addition/subtraction to an outputs of a sensitivity adjusting circuit and the offset adjusting circuit.

8. The semiconductor physical quantity sensing device of claim 2, further comprising an amplifier circuit to amplify and output the electric signal generated by the sensor element, wherein the adjusting circuit further includes an offset adjusting circuit to change/adjust a reference voltage for offset adjustment of the amplifier circuit.

9. The semiconductor physical quantity sensing device of claim 8, wherein the adjusting circuit further includes a temperature characteristics adjusting circuit to perform addition/subtraction to an outputs of a sensitivity adjusting circuit and the offset adjusting circuit.

10. The semiconductor physical quantity sensing device of claim 3, further comprising an amplifier circuit to amplify and output the electric signal generated by the sensor element, wherein the adjusting circuit further includes an offset adjusting circuit to change/adjust a reference voltage for offset adjustment of the amplifier circuit.

11. The semiconductor physical quantity sensing device of claim 10, wherein the adjusting circuit further includes a temperature characteristics adjusting circuit to perform addition/subtraction to an outputs of a sensitivity adjusting circuit and the offset adjusting circuit.

12. A semiconductor physical quantity sensing device, comprising:
    a sensor element to generate an electric signal responsive to a detected physical quantity;
    an output terminal to output to the exterior the electric signal generated by the sensor element;
    a data input terminal to input serial digital data;
    an auxiliary memory circuit to temporarily store trimming data, for adjusting output characteristics of the sensor element, inputted from the data input terminal;
    a re-writable read-only main memory circuit to store, by way of an electrical re-write action, the trimming data stored in said auxiliary memory circuit;
    an adjusting circuit to adjust the output characteristic of the sensor element based on trimming data stored in the auxiliary memory circuit or trimming data stored in the main memory circuit;
    operation of the semiconductor physical quantity sensing device being configured to include only active and passive elements formed on the same semiconductor chip and manufactured only by a CMOS manufacturing process,
    wherein the data input terminal also functions as a terminal to output data stored in the auxiliary memory circuit;

the auxiliary memory circuit outputs stored data as serial digital data; and the semiconductor physical quantity sensing device sensing device further includes, between the data input terminal and the auxiliary memory circuit, an input/output switching circuit to switch between either supplying to the auxiliary memory circuit serial digital data inputted from the data input terminal or supplying of the data input terminal serial digital data outputted from the auxiliary memory circuit.

13. A semiconductor physical quantity sensing device, comprising:

a sensor element to generate an electric signal responsive to a detected physical quantity;

an output terminal to output to the exterior the electric signal generated by the sensor element;

a data input terminal to input serial digital data;

an auxiliary memory circuit to temporarily store trimming data, for adjusting output characteristics of the sensor element, inputted from the data input terminal;

a re-writable read-only main memory circuit to store, by way of an electrical re-write action, the trimming data stored in said auxiliary memory circuit; and an adjusting circuit to adjust the output characteristic of the sensor element based on trimming data stored in the auxiliary memory circuit or trimming data stored in the main memory circuit, operation of the semiconductor physical quantity sensing device being configured to include only active and passive elements formed on the same semiconductor chip and manufactured only by a CMOS manufacturing process, wherein the semiconductor physical quantity sensing device has seven terminals in total, including the output terminal, the data input terminal, a terminal to supply earth potential, a terminal to supply operating voltage, a terminal to input an external clock, a terminal to input signals to control internal digital circuits, and a terminal to supply a write voltage higher than an operating voltage for writing data into the main memory circuit, and also including a circuit to generate a different second write voltage based on the write voltage.

14. A semiconductor physical quantity sensing device, comprising:

a sensor element to generate an electric signal responsive to a detected physical quantity;

an output terminal to output to the exterior the electric signal generated by the sensor element;

a data input terminal to input serial digital data;

an auxiliary memory circuit to termporarily store trimming data, for adusting output characteristics of the sensor element, inputted from the data input terminal;

a re-writable read-only main memory circuit to store, by way of an electrical re-write action, the trimming data stored in said auxiliary memory circuit; and an adjusting circuit to adjust the output characteristic of the sensor element based on trimming data stored in the auxiliary memory circuit or trimming data stored in the main memory circuit, operation of the semiconductor physical quantity sensing device being configured to include only active and passive elements formed on the same semiconductor chip and manufactured only by a CMOS manufacturing process, wherein the semiconductor physical quantity sensing device has eight terminals in total, including the output terminal, the data input terminal, a terminal to supply earth potential, a terminal to supply operating voltage, a terminal to input an external clock, a terminal to input signals to control internal digital circuits, a terminal to supply first write voltage higher than an operating voltage to write data into the main memory circuit, and a terminal to supply a second write voltage higher than the operating voltage and different from the first write voltage.

15. A semiconductor physical quantity sensing device, comprising:

a sensor element to output an electrical signal indicating a detected physical quantity;

an output terminal to output the electrical signal, generated by the sensor element, to outside the semiconductor physical quantity sensing device;

a data input terminal to input serial digital data;

a ground terminal to supply a ground potential;

a power supply terminal to supply a power supply voltage;

an auxiliary memory circuit to temporarily store trimming data, for adjusting output characteristics of the sensor element, inputted from the data input terminal;

a re-writable read-only main memory circuit to store, by way of an electrical re-write action, the trimming data stored in said auxiliary memory circuit; and a first write terminal to input an external clock or supply a first write voltage higher than the power supply voltage to write data into the main memory circuit;

a second write terminal to supply a second write voltage, higher than the power supply voltage and different from the first write voltage, to write data into the main memory circuit;

an operation selection circuit to control the auxiliary memory circuit and the main memory circuit based on at least a portion of digital data stored in the auxiliary memory circuit;

a signal distinguishing unit to distinguish whether a voltage applied to the first write terminal is the external clock or the first write voltage, respectively, to supply the external clock to the auxiliary memory circuit or to supply the first write voltage to the main memory circuit; and an adjusting circuit to adjust the output characteristics of the sensor element based on the trimming data stored in the auxiliary memory circuit or based on the trimming data stored in the main memory circuit, the sensor element, the auxiliary memory circuit, the main memory circuit, the operation selection circuit, the signal distinguishing unit, and the adjusting circuit being made of active elements and passive elements manufactured through a CMOS manufacturing process and being formed on one single semiconductor chip together with the output terminal, the data input terminal, the ground terminal, the power supply terminal, the first write terminal, and the second write terminal.

16. The semiconductor physical quantity sensing device of claim 15, wherein the signal distinguishing unit distinguishes whether the voltage applied to the first write terminal is the first write voltage based on the voltage applied to the first write terminal being higher than the power supply voltage and whether the voltage applied to the first write terminal is the external clock based on the voltage applied to the first write terminal being lower than the power supply voltage.

17. The semiconductor physical quantity sensing device of claim 15, wherein the auxiliary memory circuit converts inputted serial digital data to parallel digital data and supplies the converted parallel digital data to circuits inside the semiconductor physical quantity sensing device.

18. The semiconductor physical quantity sensing device of claim 15, wherein the adjusting circuit comprises a sensitivity adjusting circuit to trim current fed to the sensor element to set a sensitivity of the sensor element based on the trimming data.

19. The semiconductor physical quantity sensing device of claim 18, wherein the adjusting circuit further comprises a temperature characteristics adjusting circuit to perform addition and subtraction to an output of the sensitivity adjusting circuit.

20. The semiconductor physical quantity sensing device of claim 15, wherein the semiconductor physical quantity sensing device further comprises an amplifier circuit to amplify the electric signal generated by the sensor element and output the amplified electric signal, and the adjusting circuit comprises an offset adjusting circuit to trim a reference voltage for trimming an offset of the amplifier circuit.

21. The semiconductor physical quantity sensing device of claim 20, wherein the adjusting circuit further comprises a temperature characteristics adjusting circuit to perform addition and subtraction to an output of the sensitivity adjusting circuit and to an output of the offset adjusting circuit.

* * * * *

UNITED STATES PATENT AND TRADEMARK OFFICE
CERTIFICATE OF CORRECTION

PATENT NO.         : 7,180,798 B2
APPLICATION NO. : 10/406604
DATED                 : February 20, 2007
INVENTOR(S)       : Mutsuo Nishikawa et al.

It is certified that error appears in the above-identified patent and that said Letters Patent is hereby corrected as shown below:

Column 16, Line 59, After "circuit" change ";" to --,--.

Column 17, Line 3-4, After "sensing device" delete "sensing device" (Second Occurrence).

Column 17, Line 8, After "supplying" change "of" to --to--.

Column 17, Line 50, Change "termporarily" to --temporarily--.

Column 17, Line 51, Change "adusting" to --adjusting--.

Signed and Sealed this

Eighth Day of April, 2008

JON W. DUDAS
*Director of the United States Patent and Trademark Office*